United States Patent
Takehara et al.

(10) Patent No.: US 6,331,670 B2
(45) Date of Patent: *Dec. 18, 2001

(54) SOLAR CELL MODULE HAVING AN OVERVOLTAGE PREVENTIVE ELEMENT AND SUNLIGHT POWER GENERATION SYSTEM USING THE SOLAR CELL MODULE

(75) Inventors: Nobuyoshi Takehara; Naoki Manabe, both of Souraku-gun (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/450,426

(22) Filed: Nov. 30, 1999

(30) Foreign Application Priority Data

Nov. 30, 1998 (JP) .................................................. 10-339515
Nov. 10, 1999 (JP) .................................................. 11-319348

(51) Int. Cl.$^7$ .................................................. H01L 31/042
(52) U.S. Cl. .................. 136/244; 136/251; 136/255; 136/259; 136/261; 136/293; 136/291; 60/641.8; 323/906; 323/221
(58) Field of Search .................... 136/244, 251, 136/255, 259, 261, 293, 291; 60/641.8; 323/906, 221

(56) References Cited

U.S. PATENT DOCUMENTS

| | | | |
|---|---|---|---|
| 4,434,395 | * 2/1984 | Higuchi | 320/166 |
| 5,389,158 | * 2/1995 | Fraas et al. | 136/244 |
| 5,488,282 | * 1/1996 | Hayden et al. | 136/293 |
| 5,500,052 | * 3/1996 | Horiuchi et al. | 136/293 |
| 5,616,185 | * 4/1997 | Kukulka | 136/244 |
| 5,714,869 | * 2/1998 | Tamechika et al. | 320/101 |
| 5,955,885 | * 9/1999 | Kurokami et al. | 324/426 |

FOREIGN PATENT DOCUMENTS

| | | |
|---|---|---|
| 4-306884 | 10/1992 | (JP) . |
| 5-30656 | 2/1993 | (JP) . |
| 5-95150 | 12/1993 | (JP) . |
| 7-89302 | 9/1995 | (JP) . |
| 2580185 | 11/1996 | (JP) . |
| 2580185 B2 | * 11/1996 | (JP) . |

* cited by examiner

Primary Examiner—Alan Diamond
(74) Attorney, Agent, or Firm—Fitzpatrick, Cella, Harper & Scinto

(57) ABSTRACT

A solar cell module in which a plurality of photovoltaic elements are installed such that they are electrically connected with each other, wherein an overvoltage preventive element is electrically connected to each photovoltaic element in parallel connection, and the overvoltage preventive element exhibits a one-way continuity and has a minimum operating voltage which is smaller than an open-circuit voltage of the photovoltaic element and is greater than an optimum operating voltage of the photovoltaic element. A sunlight power generation system comprises the solar cell module and an inverter.

30 Claims, 18 Drawing Sheets

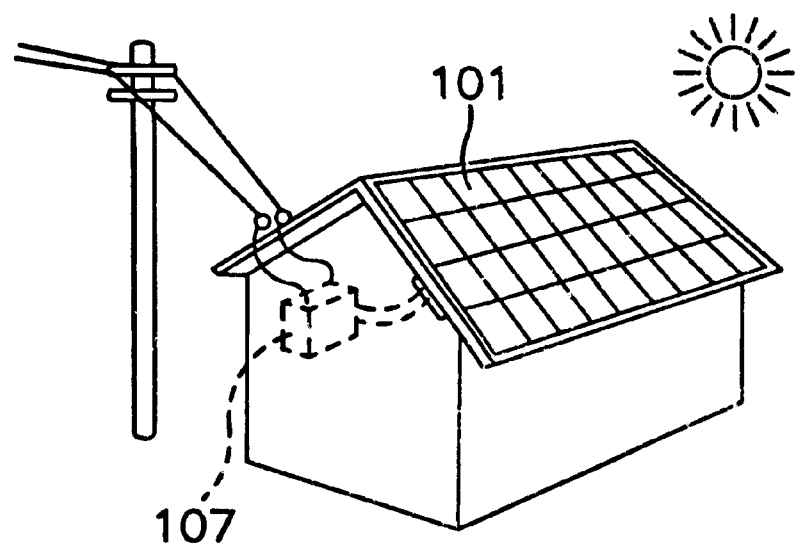
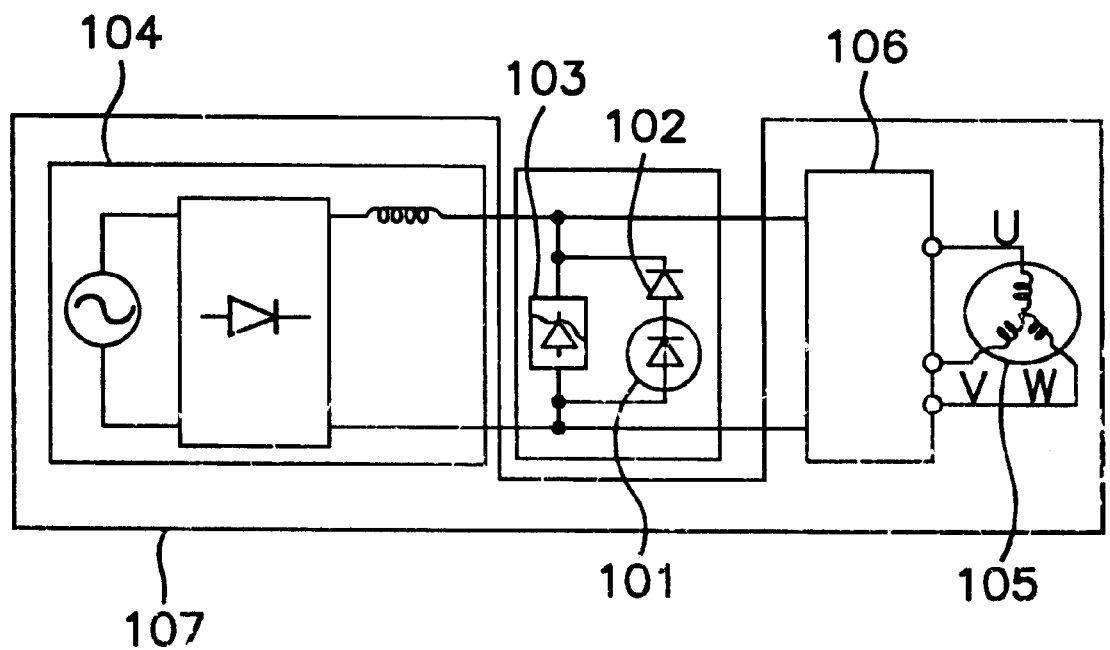
FIG. 1
PRIOR ART

F I G. 6(A)
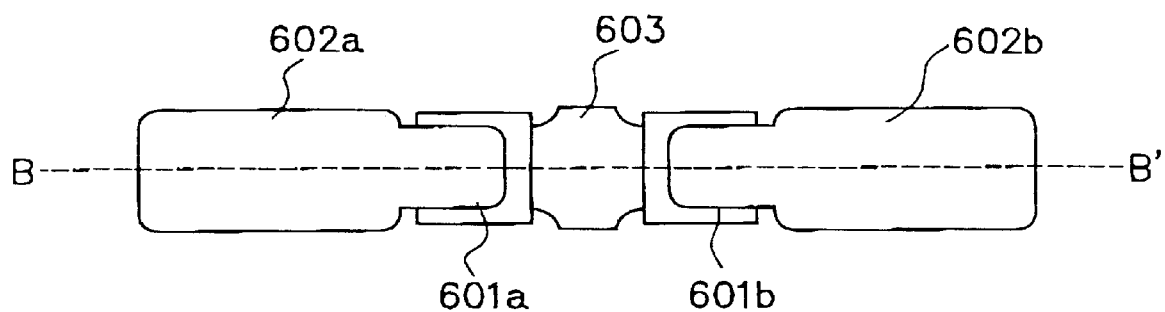

F I G. 6(B)
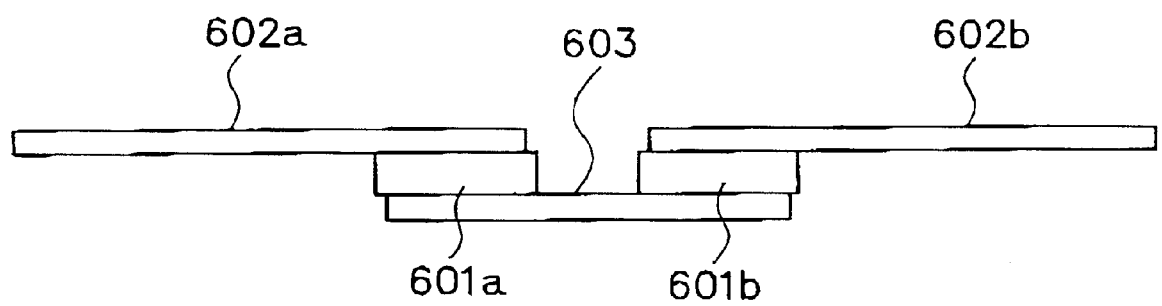

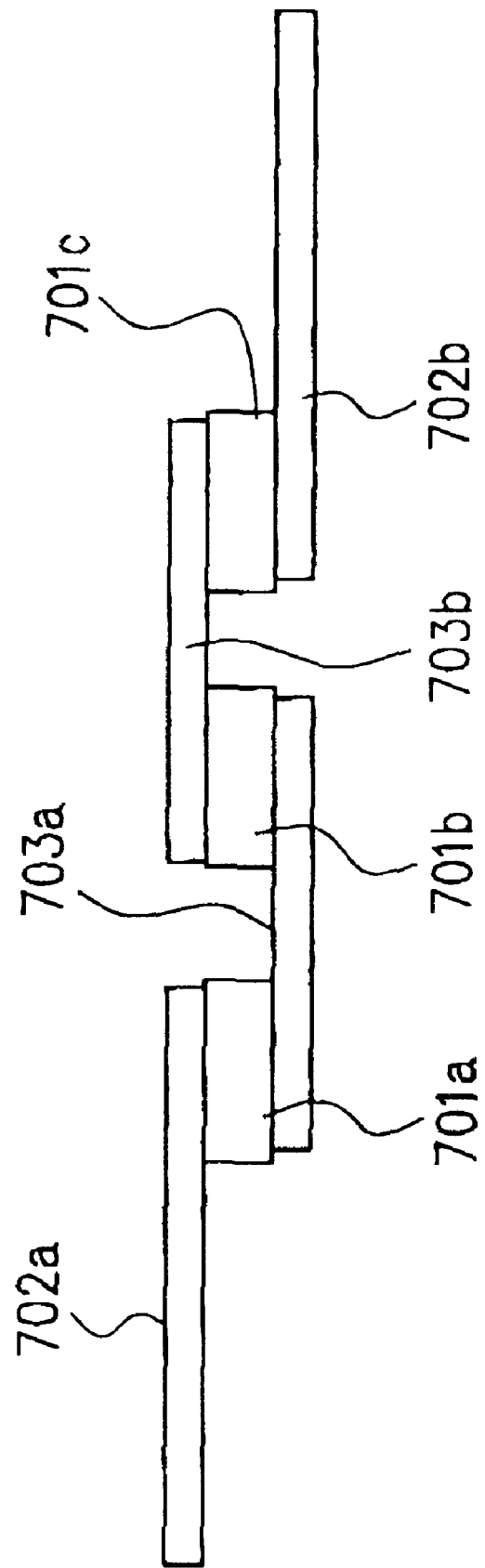

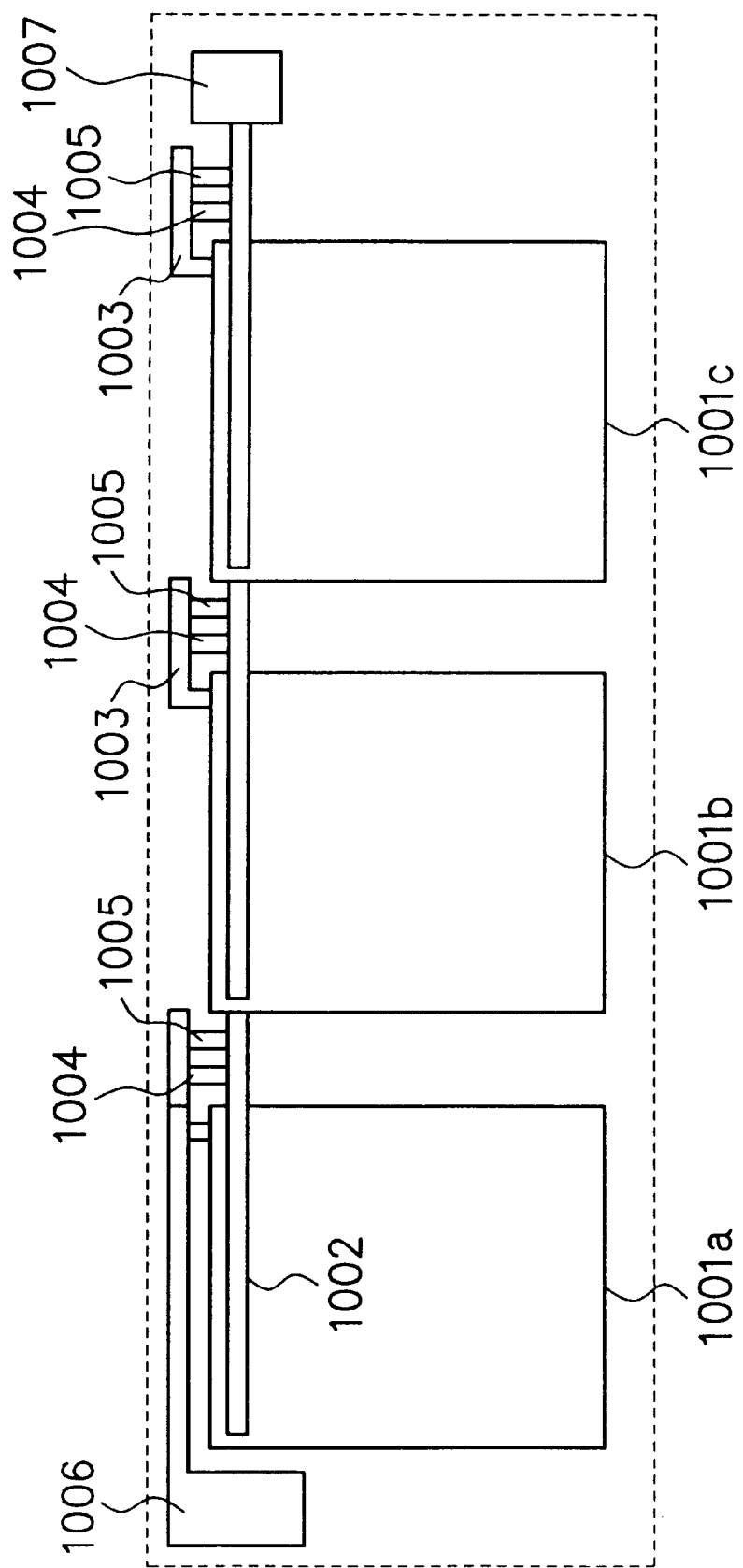

F I G. 11
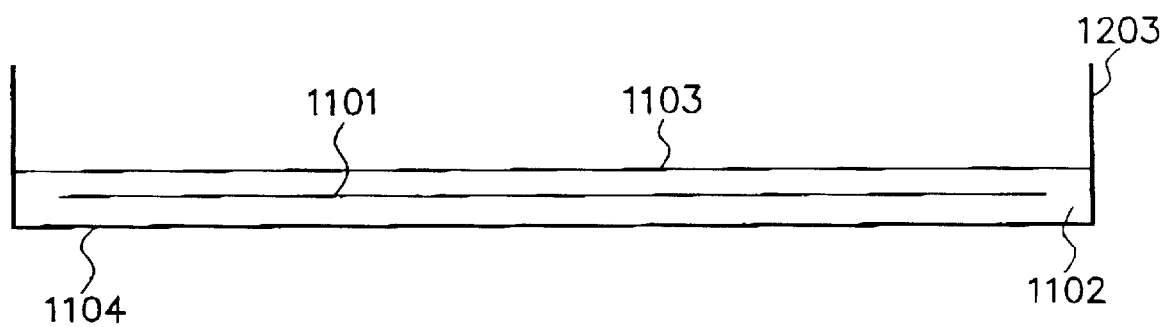

US 6,331,670 B2

SOLAR CELL MODULE HAVING AN OVERVOLTAGE PREVENTIVE ELEMENT AND SUNLIGHT POWER GENERATION SYSTEM USING THE SOLAR CELL MODULE

BACKGROUND OF THE INVENTION

1. Field of the Invention

The present invention relates to a solar cell module comprising a plurality of photovoltaic elements (or solar cells) having an overvoltage preventive element and a sunlight power generation system using said solar cell module.

2. Related Background Art

A solar cell has such a property that because of its characteristics, the voltage is varied depending on a given load factor. For instance, the open-circuit voltage of a solar cell in a non-loaded state is always greater than the optimum operating voltage at which the output of the solar cell becomes maximum. In order for a solar cell to be efficiently used as a power generation device, the purpose can be achieved by actuating the solar cell at an optimum operating point (that is, by imparting an optimum load resistance to the solar cell). However, in the case where the load is lightened (that is, the load resistance value is enlarged), the voltage of the direct current circuit of the solar cell is increased, where when the solar cell is in a stopped state, the voltage is increased up to aforesaid open-circuit voltage. In this connection, for a power converter or the like to be connected to the direct current circuit of the solar cell, it is necessary to withstand against said voltage.

Incidentally, in the case of an ordinary amorphous silicon (a-Si) solar cell whose semiconductor layer comprises an a-Si material, it is known that the fill factor (F.F.) of the a-Si solar cell is inferior to that of a single crystal silicon solar cell whose semiconductor layer comprises a single crystal silicon material, and when the optimum operating voltage at which the output of the a-Si solar cell becomes maximum is the same as that at which the output of the single crystal silicon solar cell becomes maximum, the open-circuit voltage of the a-Si solar cell is greater than that of the single crystal silicon solar cell, and wherein when the open-circuit voltage is excessively large, overvoltage is generated.

In this connection, in the case of a sunlight power generation system in which such a-Si solar cell is used, an electric device such as a power converter or the like used therein is necessary to withstand against an increased voltage.

As a measure to comply with overvoltage which is generated when the open-circuit voltage is large as above described, an overvoltage preventive means is described in Japanese Patent No. 2580185 (issued Nov. 21, 1996) [hereinafter referred to as document 1].

Description will be made of the overvoltage preventive means described in document 1 with reference to FIG. 1. In FIG. 1, reference numeral 101 indicates a solar cell panel, reference numeral 102 a reverse current preventive diode, reference numeral 103 a voltage limit element, reference numeral 104 a constant-voltage D.C. power source, reference numeral 105 a compressor driving-motor, reference numeral 106 an inverter power module, and reference numeral 107 an inverter air-conditioner.

As shown in FIG. 1, to a serialized body (that is, a solar cell array) comprising the solar cell panel 101 and the reverse current preventive diode 102, the voltage limit element 103 is connected in parallel connection, and the paralleled circuit is connected to the compressor driving-motor 105 as a load. In the case where the quantity of solar radiation is large and the load is small, by making a dump power caused in the solar cell panel 101 to be consumed in the voltage limit element 103, occurrence of overvoltage is prevented.

Besides, another overvoltage preventive means is described in Japanese Patent Publication No. 89302/1995 (hereinafter referred to as document 2). Description will be made of the overvoltage preventive means described in document 2 with reference to FIG. 2. In FIG. 2, reference numeral 201 indicates a solar cell, reference numeral 202 an inverter, reference numeral 203 a control circuit, reference numeral 204 a short-circuiting switch, reference numeral 205 a voltage-dividing circuit, and reference numeral 206 an induction motor.

As shown in FIG. 2, a plurality of solar cells 201 are electrically serialized into a solar cell array, where the switch 204 for short-circuiting part of the solar cell array (the serialized solar cells) and the control circuit 203 for controlling the opening and closing of the switch 204 are provided. In the case where the generated voltage of the solar cell array becomes excessive, the control circuit 203 is actuated to close the switch 204 thereby to short-circuit part of the solar cell array, whereby overvoltage is prevented from occurring.

However, for these overvoltage preventive means, there are problems as will be described below.

In the case described in document 1, because the voltage limit element 103 is connected to the solar cell array (the serialized body) in parallel connection, the dump power caused in the solar cell array is entirely consumed in the voltage limit element. In this connection, there are such problems as will be described in the following. That is, the more the output of the solar cell array is increased, the more the power consumed in the voltage limit element is increased, where, for instance, when the output of the solar cell array becomes some hundreds wattage (W) or more, the power consumed in the voltage limit element is markedly increased and as a result, the voltage limit switch is extremely heated. Therefore, it is necessary to establish a large space for radiating heat from the voltage limit switch to cool the voltage limit switch.

In the case described in document 2, there are problems such that in order to short-circuit part of the solar cell array, extra short-circuiting wires which are extending from a prescribed position of the solar cell array, the specialized switch for the short-circuiting, the specialized control circuit for controlling the opening and closing of the short-circuiting switch, and the specialized power source for driving the control circuit are necessitated, and because of this, the system involved is unavoidably complicated.

SUMMARY OF THE INVENTION

The present invention is aimed at solving the problems found in the prior art and providing an improved solar cell module free of such problem.

Another object of the present invention is to provide a solar cell module comprising a plurality of photovoltaic elements (solar cells) electrically connected with each other, wherein each of said plurality of photovoltaic elements is provided with an overvoltage preventive element electrically connected thereto in parallel connection, and said overvoltage preventive element comprises an element which exhibits one-way continuity and has a minimum operating voltage (hereinafter referred to as "Vmin") which is smaller than an open-circuit voltage (hereinafter referred to as "Voc") of said photovoltaic element but is greater that an optimum operating voltage (hereinafter referred to as "Vpm") of the photovoltaic element.

A further object of the present invention is to provide a sunlight power generation system comprising aforesaid solar cell module and a system interconnection inverter for reverse-flowing a D.C. output from the solar cell module into an alternating-current circuit.

A further object of the present invention is to provide a sunlight power generation system comprising aforesaid solar cell module and a system in which a D.C. power outputted from the solar cell module and a D.C. power obtained from the commercial alternating-current circuit by way of rectification are connected in parallel to supply into a load.

According to the present invention, it is not necessary to externally add a specialized overvoltage-preventing apparatus to a solar cell module, where it is not necessary to establish a particular place for such overvoltage-preventing apparatus to be arranged and therefore, the flexibility for the installation of the solar cell module is improved. In addition, in the present invention, the overvoltage preventive element is provided at each of the photovoltaic elements which are separately arranged such that the overvoltage preventive elements are space arranged so as to have a prescribed space between each adjacent overvoltage preventive elements and because of this, convergence of heat caused due to power consumption in the overvoltage preventive elements is hardly occurred. Therefore, it is necessary to adopt a particular measure for radiating heat of the overvoltage preventive elements (that is, for cooling the overvoltage preventive elements), such that a specialized space or the like for radiating heat of the overvoltage preventive elements is provided. Further, it is not necessary to adopt such complicated measure as in the prior art in that in order to short-circuit part of the solar cell array, extra short-circuiting wires which are extending from a prescribed position of the solar cell array, the specialized switch for the short-circuiting, the specialized control circuit for controlling the opening and closing of the short-circuiting switch, and the specialized power source for driving the control circuit are used.

Thus, according to the present invention, the prevention of occurrence of overvoltage in a solar cell module can be readily and effectively attained by a simple manner.

Further, according to the present invention, the control of the Vop (open-circuit voltage) can be separately performed for each photovoltaic element (solar cell) and therefore, the selectable range for the number of solar cells to be serialized is widened. This situation makes it possible to more freely design appropriate arrangement for solar cells to be installed on a given roof of a building. In addition, according to the present invention, a solar cell power generation system having a high system voltage and which is slight in system loss can be readily attained. And for components including a power converter used in the solar cell power generation system, those which are relative low in withstand voltage and less expensive can be used. This situation leads to a reduction in the production cost of a solar cell power generation system.

Incidentally, in the case where the photovoltaic element (the solar cell) is of a large fill factor (F.F.), in comparison with a photovoltaic element (solar cell) whose fill factor being small, the ratio between the Voc (the open-circuit voltage) and the Vpm (the optimum operating voltage) is greater.

And in the case where the photovoltaic element (solar cell) comprises an amorphous photovoltaic element (solar cell) whose photoelectric conversion semiconductor layer comprising an amorphous semiconductor material containing silicon or/and germanium atoms, the fill factor (F.F.) of the amorphous photovoltaic element is generally inferior to that of a single crystal silicon photovoltaic element (solar cell).

In this connection, particularly in a solar cell power generation system comprising a plurality of amorphous photovoltaic elements (solar cells) having a photoelectric conversion semiconductor layer comprising such amorphous semiconductor material as above described, the foregoing effects of the overvoltage preventive elements are significant.

BRIEF DESCRIPTION OF THE DRAWINGS

FIG. 1 is a schematic view illustrating an example of a conventional overvoltage preventive means used in a solar cell panel.

FIG. 6(A) is a schematic diagram illustrating an example of an overvoltage preventive element in the present invention, viewed from above.

FIG. 6(B) is a schematic cross-sectional view, taken along the line B–B' in FIG. 6(A).

FIG. 7(B) is a schematic cross-sectional view, taken along the line C–C' in FIG. 7(A).

FIG. 10 is a schematic plan view illustrating an example of the constitution of a solar cell module in the present invention.

FIG. 11 is a schematic cross-sectional view illustrating an example of a complete solar cell module in the present invention.

DETAILED DESCRIPTION OF THE INVENTION AND PREFERRED EMBODIMENTS

Figure 2:
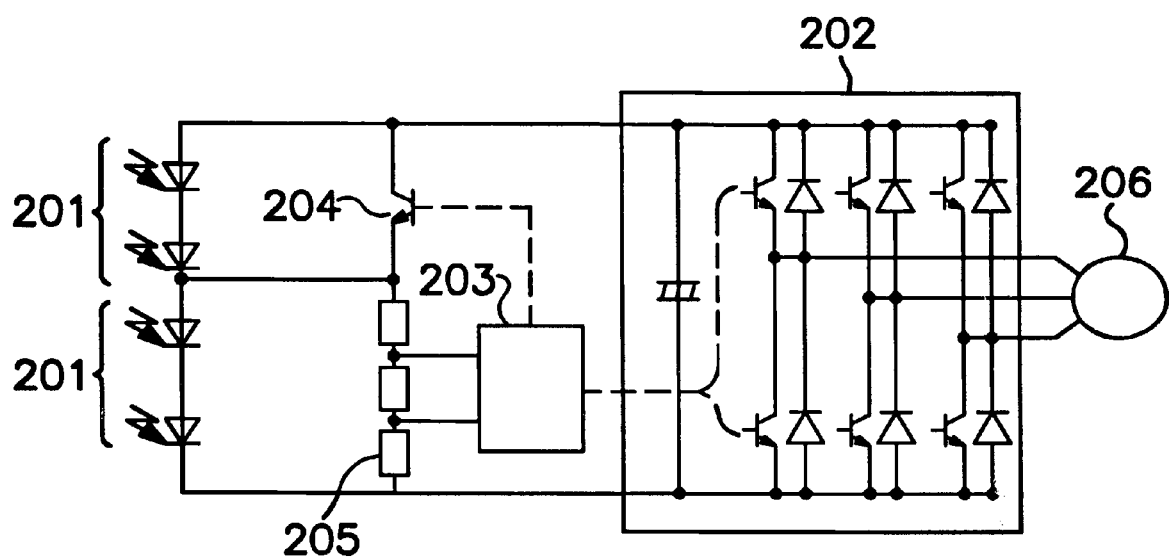
FIG. 2 is a schematic view illustrating another example of a conventional overvoltage preventive means used in a solar cell array.

The present invention is to eliminate the foregoing problems found in the prior art and to attain the above described objects.

A principal feature of the present invention resides in an overvoltage preventive element which is connected in parallel to each of photovoltaic elements constituting a solar cell provided in a solar cell module. The solar cell here means a serialized body comprising a plurality of photovoltaic elements electrically connected with each other in series connection.

The overvoltage preventive element typically comprises an element which exhibits one-way continuity and has a minimum operating voltage (Vmin) which is smaller than the Voc (open-circuit voltage) of the photovoltaic element but is greater that the Vpm (optimum operating voltage) of the photovoltaic element.

The overvoltage preventive element prevents occurrence of overvoltage by controlling the Voc of the photovoltaic element. When the Vmin at which the overvoltage-preventing function of the overvoltage preventive element is exhibited is extremely smaller than the Vpm of the photovoltaic element, the output loss of the solar cell is increased. In this connection, the overvoltage preventive element is necessary to be of Vmin (minimum operating voltage) which is greater than the Vpm (optimum operating voltage) but is smaller than the Voc (open-circuit voltage) of the photovoltaic elements.

The Vmin of the overvoltage preventive element may be controlled by properly adjusting the kind and numerical quantity of constituent elements of the overvoltage preventive element or/and electrical connection type among the constituent elements with respect to the output characteristics of the photovoltaic element to which the overvoltage preventive element is connected in parallel connection.

By controlling the Vmin of the overvoltage preventive element to fall in the above-described range, the overvoltage preventive element greatly exhibits its overvoltage-preventing function while minimizing the output loss of the solar cell. That is, in the current-voltage characteristics of the photovoltaic element having overvoltage preventive element, the minimum operating point of a current-voltage curve is substantially not changed, the difference between the Vpm and the Voc is small, and the gradient of a straight line which connects between the optimum operating point and the open-circuit voltage point is greater than that in the case of a photovoltaic element having no overvoltage preventive element.

In addition, by making the electrical connection type among the constituent elements of the overvoltage preventive element to be, for instance, series connection or parallel connection, it is possible to selectively use elements which are relatively inferior in withstand voltage or elements which are relatively inferior in withstand current as the constituent elements of the overvoltage preventive element. This situation enables to prepare an overvoltage preventive element which is less expensive.

In order to prevent overvoltage, there can be mentioned the following two methods (a) and (b) utilizing the characteristics of the overvoltage preventive element, that is, the current-voltage characteristics as well as in the case of a diode, i.e., a method (a) wherein the overvoltage preventive element is connected to the photovoltaic element in parallel connection in a forward direction to the photovoltaic element to prevent overvoltage and a method (b) wherein the overvoltage preventive element is connected to the photovoltaic element in parallel connection in a reverse direction to the photovoltaic element to prevent overvoltage.

Description will be made of these two methods (a) and (b).

The method (a) is that overvoltage is prevented by utilizing the forward characteristics of the overvoltage preventive element. In this method, when to comply with an increase in the quantity of solar radiation to the photovoltaic element or/and a decrease in the load connected to the photovoltaic element, the operating voltage of the photovoltaic element reaches the minimum operating voltage of the overvoltage preventive element, the overvoltage preventive element conducts in the forward direction to consume dump power of the photovoltaic element in the overvoltage preventive element thereby to control the Voc (open-circuit voltage) of the photovoltaic element.

Figure 14:
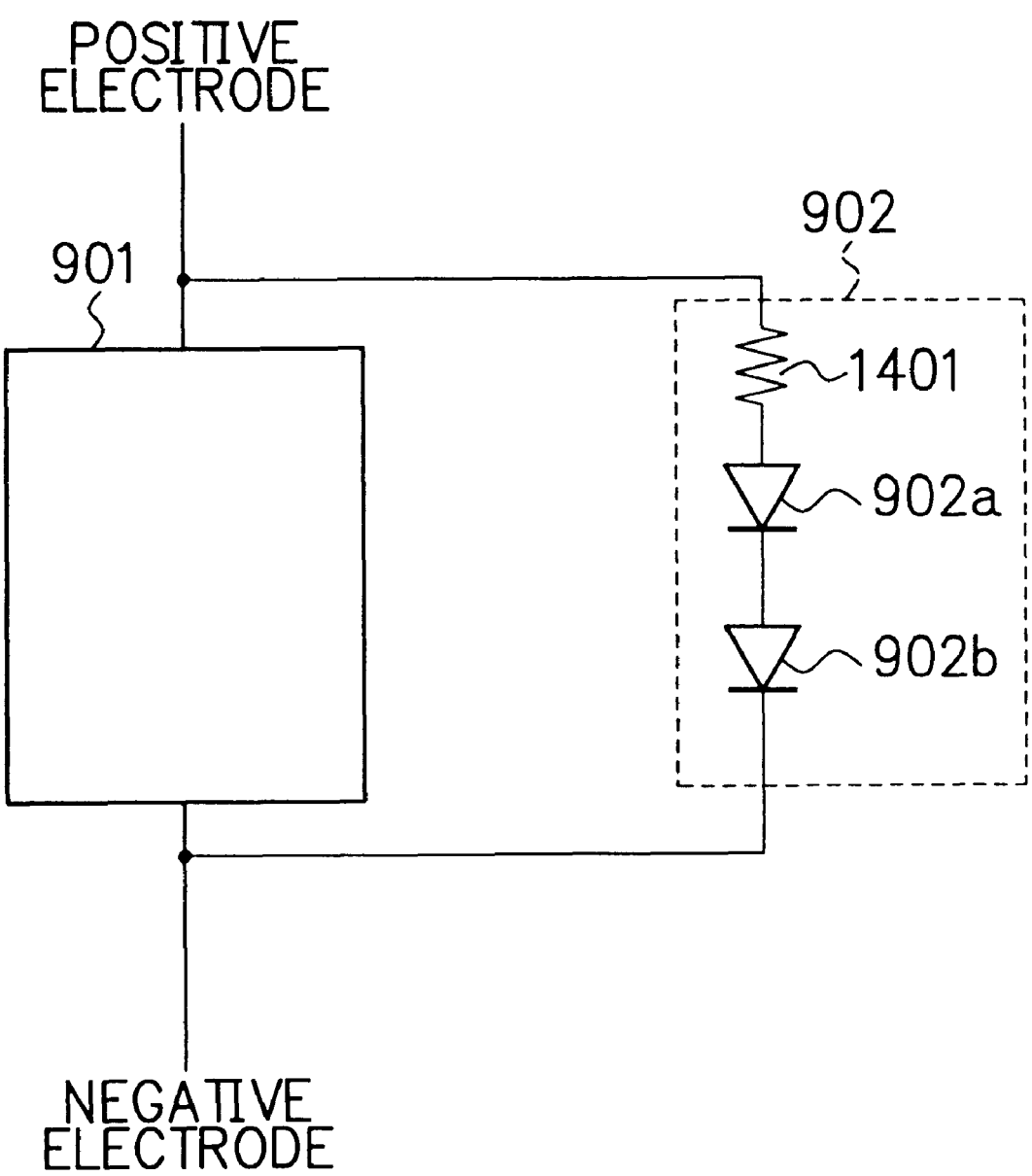
FIG. 14 is a schematic diagram illustrating an example of a circuit including an overvoltage preventive element provided in a solar cell in the present invention.

In this method (a), the overvoltage preventive element comprises a diode such as a PN junction diode or a Schottky barrier diode. It is possible that an electrical resistance element is added to the overvoltage preventive element as its constituent so that the minimum operating voltage can be finely adjusted. FIG. 14 is a schematic diagram illustrating an example of a circuit constitution of the overvoltage preventive element in this embodiment. In FIG. 14, reference numeral 901 indicates a photovoltaic element, reference numeral 902 an overvoltage preventive element, each of reference numerals 902a and 902b a PN junction diode, and reference numeral 1401 an electric resistance element.

It is possible to adopt a constitution in that the photovoltaic element, the overvoltage preventive element and a current bypass element are connected in parallel connection. The current bypass element has one-way continuity and therefore, the current bypass element is connected in parallel to the photovoltaic element in a reverse direction to the photovoltaic element. In this case, when the photovoltaic element is shaded, the current bypass element conducts to prevent the photovoltaic element from suffering breakdown due to the impression of a reverse bias to the photovoltaic element. In the case where such constitution is adopted, in order to finely control the minimum operating voltage of the overvoltage preventive element, it is desirable that the minimum continuity voltage of the current bypass element when a reverse voltage is impressed to the current bypass element is greater than the minimum operating voltage of the overvoltage preventive element when a forward voltage is impressed to the overvoltage preventive element. By this, it is possible to substantially eliminate an influence of the continuity of the current bypass element when the reverse voltage is impressed to the current bypass element. Because of this, by virtue of the element constitution of the overvoltage preventive element, the minimum operating voltage of the overvoltage preventive element can be finely controlled.

Description will be made of the method (b) wherein the overvoltage preventive element is connected to the photovoltaic element in parallel connection in a reverse direction to the photovoltaic element to prevent overvoltage.

This method is that overvoltage is prevented by utilizing a property that when a reverse bias voltage is impressed to the overvoltage preventive element, a voltage which is greater than the breakdown voltage is not impressed. In this method (b), when to comply with an increase in the quantity of solar radiation to the photovoltaic element or/and a decrease in the load connected to the photovoltaic element, the operating voltage of the photovoltaic element is increased to reach the minimum operating voltage (the breakdown voltage in this case) of the overvoltage preventive element, the overvoltage preventive element conducts in a reverse direction (that is, a reverse bias direction) to consume dump power of the photovoltaic element in the overvoltage preventive element thereby to control the Voc (open-circuit voltage) of the photovoltaic element.

Figure 15:
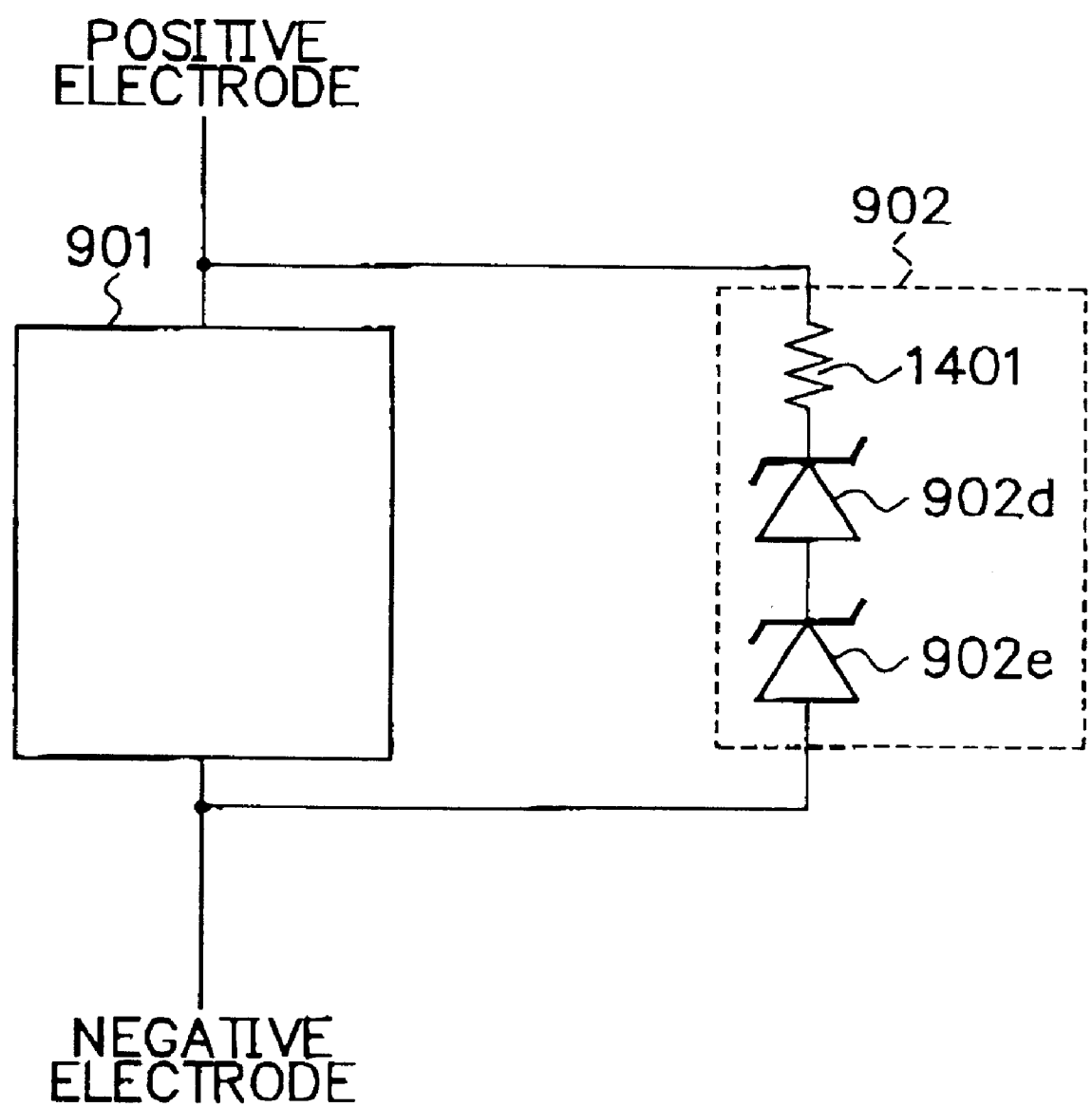
FIG. 15 is a schematic diagram illustrating another example of a circuit including an overvoltage preventive element provided in a solar cell in the present invention.

In this method (b), the overvoltage preventive element comprises a diode selected from a group consisting of a PN junction diode, a Schottky barrier diode, and a constant voltage diode. Of these, a constant voltage diode is preferred, particularly, a Zener diode is more preferred. It is possible that an electrical resistance element is added to the overvoltage preventive element as its constituent so that the minimum operating voltage can be finely adjusted. FIG. 15 is a schematic diagram illustrating an example of a circuit constitution of the overvoltage preventive element in this embodiment. In FIG. 15, reference numeral 901 indicates a photovoltaic element, reference numeral 902 an overvoltage preventive element, each of reference numerals 902d and 902e a constant voltage diode, and reference numeral 1401 an electric resistance element.

In this embodiment, because the overvoltage preventive element is connected in parallel to each photovoltaic element in a reverse direction to the photovoltaic element, the overvoltage preventive element is capable of exhibiting a current bypass function.

In this method (b), it is possible to adopt a constitution in that the photovoltaic element, the overvoltage preventive element and a current bypass element are connected in parallel connection. The current bypass element has one-way continuity and therefore, the current bypass element is connected in parallel to the photovoltaic element in a reverse direction to the photovoltaic element. In this case, when the photovoltaic element is shaded, the current bypass element conducts to prevent the photovoltaic element from suffering breakdown due to the impression of a reverse bias to the photovoltaic element. In the case where such constitution is adopted, in order to finely control the minimum operating voltage of the overvoltage preventive element, it is desirable that the minimum continuity voltage of the current bypass element when a reverse voltage is impressed to the current bypass element is greater than the minimum operating voltage of the overvoltage preventive element when a reverse voltage is impressed to the overvoltage preventive element. By this, it is possible to substantially eliminate an influence of the continuity of the current bypass element when the reverse voltage is impressed to the current bypass element. Because of this, by virtue of the element constitution of the overvoltage preventive element, the minimum operating voltage of the overvoltage preventive element can be finely controlled.

Figure 7A:
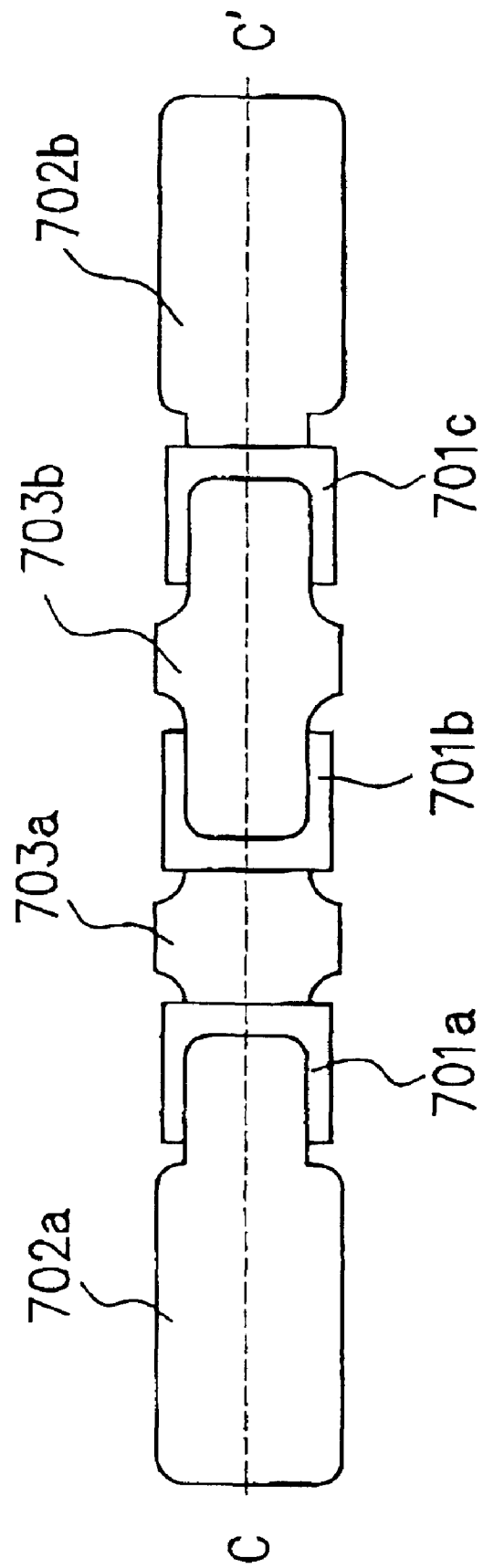
FIG. 7(A) is a schematic diagram illustrating another example of an overvoltage preventive element in the present invention, viewed from above.

In any case, the overvoltage preventive element may be constituted by a plurality of constituent elements and a plurality of connection members. For instance, as shown in FIGS. 6(A) and 6(B), for a connection member 603, a constituent element 601a is connected to one end portion of the connection member 603 and another constituent element 601b is connected to the other end portion of the connection member 603. And a connection member 602a is connected so as to sandwich and hold the element 601a between the connection member 602a and the connection member 603 and similarly, a connection member 602b is connected so as to sandwich and hold the element 601b between the connection member 602b and the connection member 603. By this, an overvoltage preventive element can be established. Alternatively, as shown in FIGS. 7(A) and 7(B), three constituent elements 701a, 701b and 701c are spacedly arranged in a common plane at an equal interval while being sandwiched and held between two connection members 703a and 702b and two connection members 702a and 703b wherein the connection member 703a is joined to the back side of each of the constituent elements 701a and 701b, the connection member 702a is joined to the upper side of the constituent element 701a, and the connection member 703b is joined to the upper side of each of the constituent elements 701b and 701c. In this way, by connecting a plurality of constituent elements [701a and 701c in FIGS. 7(A) and 7(B)] through the constituent element 701b, there can be established an overvoltage preventive element comprising a plurality of constituent elements and a plurality of connection members.

In the embodiment shown in FIGS. 7(A) and 7(B), there are shown only three constituent elements for the simplification purpose. It is possible to arrange more than three constituent elements in the same manner as above described.

In any case, it is possible to use an integrated body comprising a constituent element and one or more connection members as the constituent element.

By adopting such spatial connection format as above described, it is possible to readily prepare a more thinned overvoltage preventive element which more withstands against externally applied mechanical shock. This situation provides pronounced advantages. Particularly, in the case of a solar cell module comprising a solar cell (comprising a plurality of photovoltaic elements having an overvoltage preventive element electrically serialized with each other) integrally sealed in a weatherable resin, resin sealing defect and the like are prevented from occurring in the process of sealing the solar cell in the weatherable resin. In addition, irregularities are prevented from occurring at the exterior of the solar cell module. Further, flatness can be assured for the solar cell.

And because the overvoltage preventive element is accommodated in the solar cell module, it is not necessary to externally add a specialized overvoltage-preventing apparatus to the solar cell module and therefore, it is not necessary to establish a particular space for such overvoltage-preventing apparatus to be arranged. Thus, the flexibility for the installation of the solar cell module is improved.

Further, the overvoltage preventive element is provided at each of the photovoltaic elements which are separately arranged such that the overvoltage preventive elements are space arranged so as to have a prescribed space between each adjacent overvoltage preventive elements. Because of this, convergence of heat caused due to power consumption in the overvoltage preventive elements is hardly occurred. Therefore, it is necessary to adopt a particular measure for radiating heat of the overvoltage preventive elements (that is, for cooling the overvoltage preventive elements), such that a specialized space or the like for radiating heat of the overvoltage preventive elements is provided.

Further, because the overvoltage preventive element is accommodated in the solar cell module, it is not necessary to adopt such measure as in the prior art in that in order to short-circuit part of the solar cell array, extra short-circuiting wires are extended from a prescribed position of the solar cell array. And the solar cell module can be used in the same wiring pattern in an ordinary solar cell module.

In the following, the present invention will be described in more detail with reference to the drawings.

Photovoltaic Element

Figure 3:
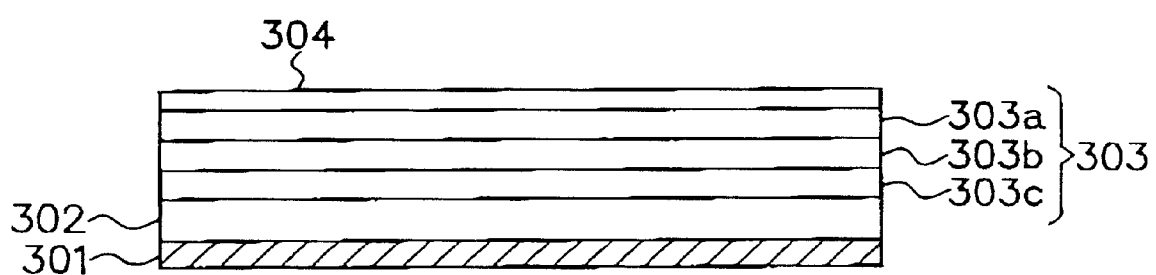
FIG. 3 is a schematic cross-sectional view illustrating an example of the layer constitution of a photovoltaic element (solar cell) used in the present invention.

FIG. 3 is a schematic cross-sectional view illustrating an example of the constitution of a photoelectric element (solar cell) used in the present invention.

The photovoltaic element shown in FIG. 3 comprises a back reflecting layer 302, a three-layered photoelectric conversion layer 303 with a semiconductor junction (comprising three semiconductor layers 303a, 303b and 303c, wherein, for instance, the layer 303a comprises a p-type microcrystalline silicon material, the layer 303 comprises an i-type amorphous material containing silicon and/or germanium atoms, and the layer 303c comprises an n-type amorphous silicon material), and a transparent electrode layer 304 stacked in this order on a metallic substrate 301.

Although this is not shown in FIG. 3, a collecting electrode is formed on the transparent electrode layer 304. The formation of the collecting electrode will be described later.

Incidentally, in each of Examples 1 to 3 and Comparative Examples 1 and 2 which will be later described, three photovoltaic elements having the above configuration were used by electrically serializing these photovoltaic elements.

Now, a photovoltaic element having such configuration as described in the above may be produced by a conventional process described in, for instance, Japanese Unexamined Patent Publication No. 21496/1994 in which a process of forming a photoelectric conversion layer in the production of a photovoltaic is described and Japanese Unexamined Patent Publication No. 139349/1996 in which a process for forming a collecting electrode in the production of a photovoltaic element is described.

The production of a photovoltaic element will be briefly described with reference to FIGS. 3, 4 and 5.

(1) First, as the substrate 301, there is provided a thin stainless plate having a thickness of, for instance, 0.125 mm.

(2) An aluminum thin film and a zinc oxide thin film are sequentially formed on the stainless plate as the substrate 301 by a conventional metallic film-forming process such as sputtering or the like, whereby a two-layered back reflecting layer comprising said aluminum thin film and said zinc oxide thin film as the back reflecting layer 302 is formed on the substrate 301.

(3) As the photoelectric conversion layer 303, in accordance with a conventional CVD film-forming process, an n-type layer comprising an amorphous silicon (a-Si) material as the layer 303c, an i-type layer comprising an amorphous silicon-germanium (a-SiGe) material as the layer 303b, and a p-type layer comprising a microcrystalline silicon material as the layer 303a are sequentially formed on the back reflecting layer 302.

(4) An ITO ($In_2O_3$—$SnO_2$) film as the transparent electrode layer 304 is formed on the layer 303a by a conventional process such as heat resistance evaporation or the like.

Thus, there is obtained a photovoltaic element having such configuration as shown in FIG. 3.

Figure 4:
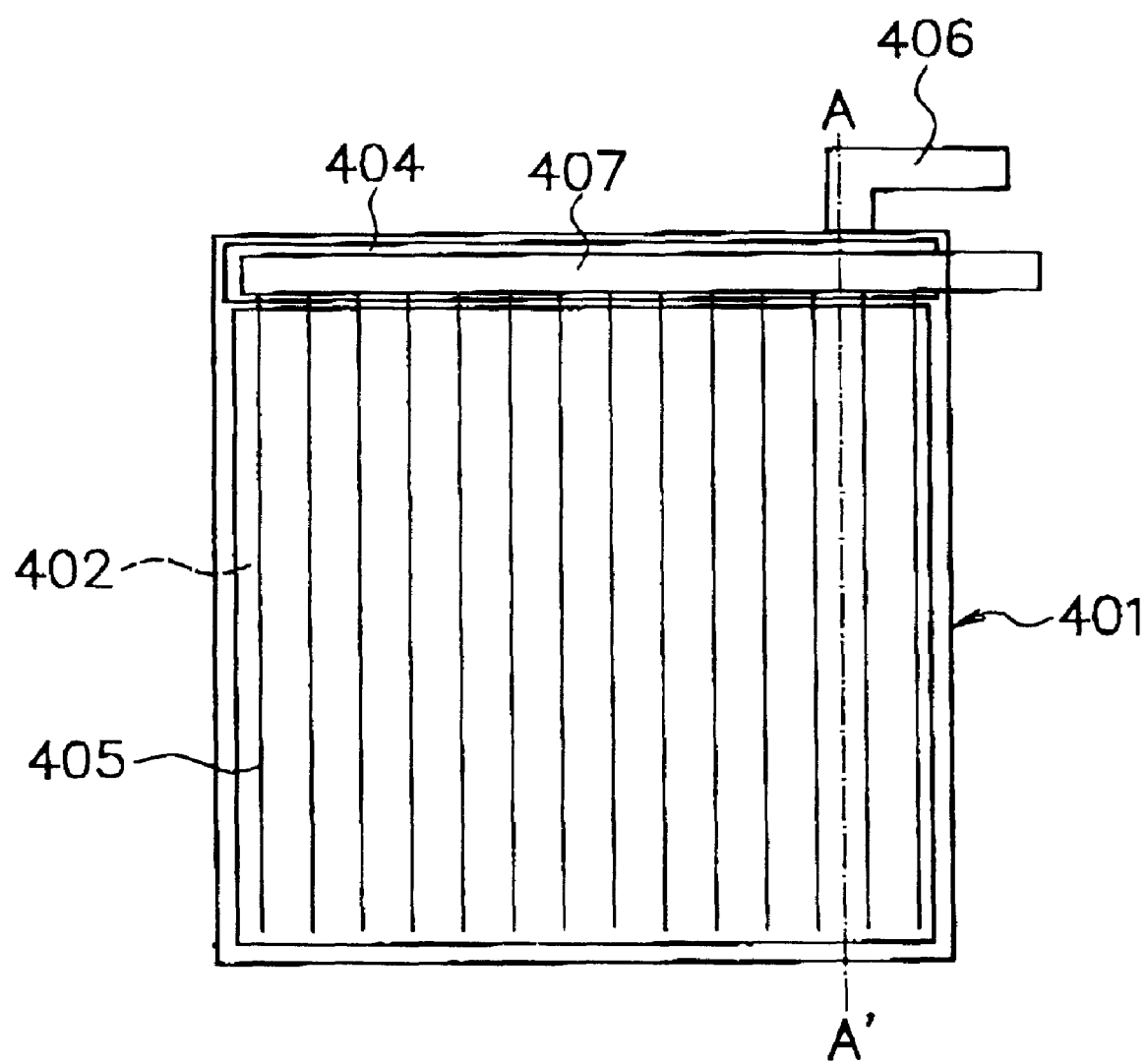
FIG. 4 is a schematic view illustrating an example of a photovoltaic element (solar cell) used in the present invention, viewed from above.
Figure 5:
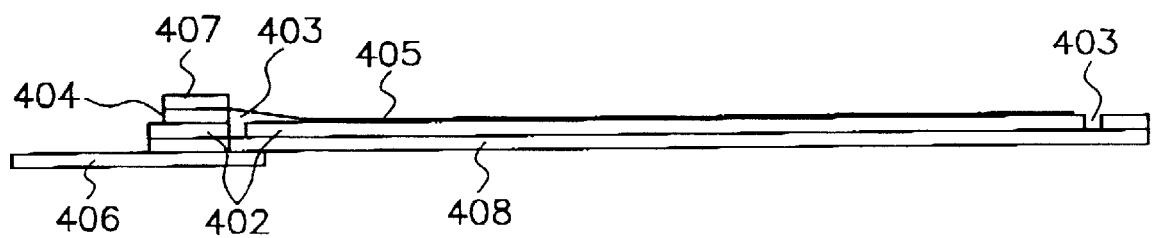
FIG. 5 is a schematic cross-sectional view, taken along the line A–A' in FIG. 4.

The photovoltaic element is then processed as will be described to obtain a photovoltaic element 401 with an electrode tub which has such configuration as shown in FIGS. 4 and 5.

FIG. 4 is a schematic view illustrating a configuration of said photovoltaic element having an electrode tub, viewed from above. FIG. 5 is a schematic cross-sectional view, taken along the line A–A' in FIG. 4.

(i) The photovoltaic element obtained in the above is cut into a plurality of photovoltaic elements having a desired size, for instance, a size of 180 mm×120 mm.

(ii) For each of the photovoltaic elements obtained in the above step (i), a peripheral portion of the two-layered region 402 comprising the photoelectric conversion layer (303) and the transparent electrode layer (304) is removed by means of chemical etching to form a void 403. The void is provided in order to prevent the element from suffering an influence due to partial short-circuit which will be occurred at an end portion of the metal substrate.

(iii) An insulating tape 404 is stuck on the isolated two-layered portion 402 as shown in FIG. 5.

(iv) A collecting electrode 405 (a grid electrode) comprising copper wires coated by an electrically conductive adhesive is laid and bonded on the transparent electrode layer of the photovoltaic element such that end portion of the collecting electrode is extended to situate on the insulating tape 404 as shown in FIGS. 4 and 5.

(v) A back electrode tub 406 comprising, for instance, a tinned copper foil of 0.1 mm in thickness and 1 cm in width and a surface electrode tub 407 comprising, for instance, a tinned copper foil of 0.1 mm in thickness and i cm in width are fixed. The distance between the back electrode tub 406 and the surface electrode tub 407 (see, FIG. 4) is made to be, for instance, 50 mm. The surface electrode tub 407 is made to have a relatively longer length in order to electrically connect the photovoltaic element 401 to other photovoltaic element 401.

In this way, there are obtained a plurality of complete photovoltaic elements having such configuration as shown in FIGS. 4 and 5.

Incidentally, for the purpose of increasing the photoelectric conversion efficiency of the photovoltaic element, the proportion of an extra wiring path (particularly, the back electrode tub 406) to occupy the light receiving face of the photovoltaic element should be as small as possible, preferably zero so that the proportion of the photoelectric conversion portion to occupy the light receiving face becomes as great as possible. However, for the purpose of more clarifying the constitution of the present invention, such configuration as above described is intentionally adopted. Thus, it should be understood that the present invention is not limited to this configuration.

Overvoltage Preventive Element

FIG. 6(A) is a schematic diagram illustrating an example of an overvoltage preventive element used in the present invention, viewed from above. FIG. 6(B) is a schematic cross-sectional view, taken along the line B–B' in FIG. 6(A).

The overvoltage preventive element shown FIGS. 6(A) and 6(B) comprises two constituent elements 601a and 601b, two electrode tubs 602a and 602b, and an intermediate connection electrode tub 603, where the two constituent elements are made to be a serialized body. Particularly, as shown in FIG. 6(B), the electrode tubs 602a and 602b and the intermediate connection electrode tub 603 are connected to the constituent elements 601a and 601b while being staggered above and below.

By adopting such spatial connection format as above described, it is possible to thin the thickness of the overvoltage preventive element. And flatness can be assured for the photovoltaic element. Particularly, in the case where such solar cell module configuration as will be described later in that a serialized body (a solar cell) comprising a plurality of photovoltaic elements having such overvoltage preventive element as above described electrically serialized is integrally sealed in a weatherable resin is adopted, resin sealing defect and the like are prevented from occurring in the process of sealing the serialized body (the solar cell) in the weatherable resin. In addition, irregularities are prevented from occurring at the exterior of the solar cell module.

The kind, performance, size, form and the like of the constituent element of the overvoltage preventive element should be properly determined depending upon the size, output characteristics, and connection pattern of the photovoltaic element to which the overvoltage preventive element is connected and also depending upon the performance required for the solar cell module involved.

In any case, it is necessary to selectively adopt a constituent element which enables to provide an overvoltage preventive element which has one-way continuity as a whole and a desired minimum operation voltage and which withstands the actuating current of the photovoltaic element involved. With consideration of the flatness of the photovoltaic element, the constituent element is desired to be in a form which is as small as possible and is as thin as possible. For instance, a diode is used as the constituent element, a chip diode or a flat diode is preferably used. Specifically, a PN junction diode, a Schottky barrier diode, a constant voltage diode and an electrical resistance element may be selectively used as the constituent element.

Particularly in the case where the overvoltage preventive element is connected in parallel to the photovoltaic element in a forward direction to the photovoltaic element, a PN junction diode or a Schottky barrier diode is preferably used. In this case, for the PN junction diode, a rectifier diode and a light emitting diode are more preferred.

Now, since the output voltage of the photovoltaic element is generally an extent of several voltages, the withstand reverse voltage of the overvoltage preventive element is sufficient to be somewhat greater than several voltages.

On the other hand, in the case where the overvoltage preventive element is connected in parallel to the photovoltaic element in a reverse direction to the photovoltaic element, constant voltage diodes such as a Zener diode and an Avalanche diode are preferably used.

As each of the electrode tubs 602a and 602b and the intermediate connection electrode tub 603 (these tubs will be collectively referred to as "connection member" in the following), a metal foil is preferably used. As the material of constituting the metal foil, metals such as Au, Ag, Cu, Sn, Pb, Ni and the like which are highly electrically conductive and can be readily soldered and can be readily processed are preferred. These are not restrictive. Besides, it is possible to use plated metal members such as an Au-plated copper member, an Ag-plated copper member, a solder-plated copper member, a Sn-plated copper member and the like.

The size of the connection member should be properly determined depending upon the size, output characteristics, and connection pattern of the photovoltaic element to which the overvoltage preventive element is connected and also depending upon the performance required for the solar cell module involved.

To join the connection member and the constituent element may be performed by means of soldering or laser beam welding. For the joining between the connection member and the constituent element, it is sufficient as long as the joined portion between the connection member and the constituent element is ensured in terms of the mechanical strength and electrical connection between the connection member and the constituent element is ensured.

The foregoing spatial connection format in FIGS. 6(A) and 6(B) is not limited to the series connection but it may be also employed in the parallel connection.

FIG. 7(A) is a schematic diagram illustrating an example of an overvoltage preventive element used in the present invention, viewed from above. FIG. 7(B) is a schematic cross-sectional view, taken along the line C–C' in FIG. 7(A).

The overvoltage preventive element shown in FIGS. 7(A) and 7(B) comprises three constituent elements 701a, 701b and 701c, two electrode tubs 702a and 702b, and two intermediate connection electrode tubs 703a and 703b, where the three constituent elements are made to be a serialized body. Particularly, as shown in FIG. 7(B), the electrode tubs 702a and 702b and the intermediate connection electrode tubs 703a and 703b are connected to the constituent elements 701a, 701b and 701c while being staggered above and below.

By adopting such spatial connection format as above described, it is possible to thin the thickness of the overvoltage preventive element. And flatness can be assured for the photovoltaic element. Particularly, in the case where such solar cell module configuration as will be described later in that a serialized body (a solar cell) comprising a plurality of photovoltaic elements having such overvoltage preventive element as above described electrically serialized is integrally sealed in a weatherable resin is adopted, resin sealing defect and the like are prevented from occurring in the process of sealing the serialized body (the solar cell) in the weatherable resin. In addition, irregularities are prevented from occurring at the exterior of the solar cell module.

The constituent element and the connection member in this embodiment are the same as in the case shown in FIGS. 6(A) and 6(B).

The spatial connection format in FIGS. 7(A) and 7(B) is not limited to the series connection but it may be also employed in the parallel connection.

Current Bypass Element

Figure 8A:
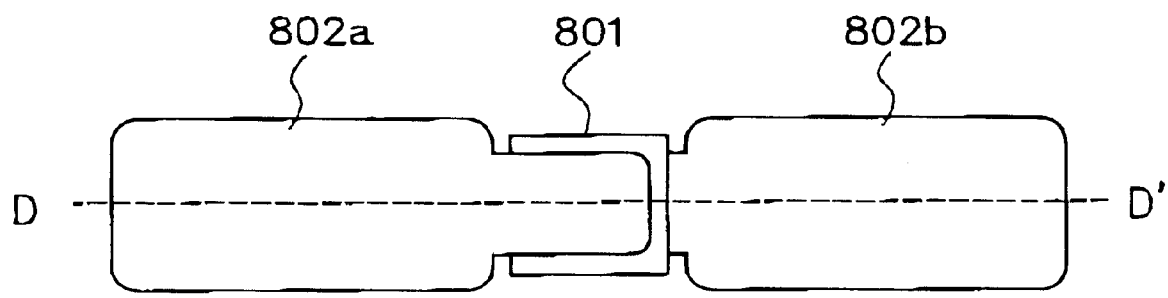
FIG. 8(A) is a schematic diagram illustrating a further example of an overvoltage preventive element (comprising a current bypass element) in the present invention, viewed from above.
Figure 8B:
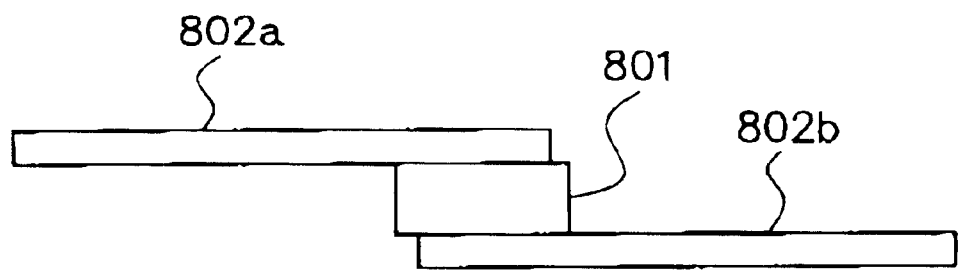
FIG. 8(B) is a schematic cross-sectional view, taken along the line D–D' in FIG. 8(A).

FIG. 8(A) is a schematic diagram illustrating an example of a current bypass element which is preferably used in the present invention, viewed from above. FIG. 8(B) is a schematic cross-sectional view, taken along the line D–D' in FIG. 8(A).

The current bypass element shown in FIGS. 8(A) and 8(B) comprises a PN junction diode 801 sandwiched by a pair of electrode tubs 802a and 802b. By adopting such spatial connection format, the thickness of the current bypass element can be thinned as desired. This situation leads to assure flatness for the photovoltaic element.

The kind, performance, size, form and the like of the diode used in the current bypass element should be properly determined depending upon the related factors including the size and connection pattern of the photovoltaic element to which the current bypass element is connected and the electric current used, and also depending upon the performance required for the solar cell module involved.

In any case, it is necessary to selectively adopt a constituent element which enables to provide a current bypass which has one-way continuity as a whole and withstands the short-circuit current of the photovoltaic element involved. With consideration of the flatness of the photovoltaic element, the constituent element is desired to be in a form which is as small as possible and is as thin as possible.

Particularly, in the case where such solar cell module configuration as will be described later in that a serialized body (a solar cell) comprising a plurality of photovoltaic elements having such current bypass element as above described electrically serialized is integrally sealed in a weatherable resin is adopted, in order to prevent resin sealing defect and the like from occurring in the process of sealing the serialized body (the solar cell) in the weatherable resin and also in order to prevent irregularities from occurring at the exterior of the solar cell module, it is desired for the diode 801 to be thin. As such diode, a chip diode or a flat diode is preferably used.

As the electrode tubs 802a and 802b, those mentioned in the above as the connection member of the overvoltage preventive element can be used.

Incidentally, Japanese Unexamined Patent Publication No. 302923/1995 discloses a current bypass element in which a chip diode is used and a process for the production thereof. In the present invention, such current bypass element disclosed in this document may be used.

Solar Cell Module

The solar cell module according to the present invention comprises a plurality of photovoltaic elements having such configuration as previously described, wherein each photovoltaic element has an overvoltage preventive element having such configuration as previously described, and if necessary, such current bypass element as above described.

Figure 9A:
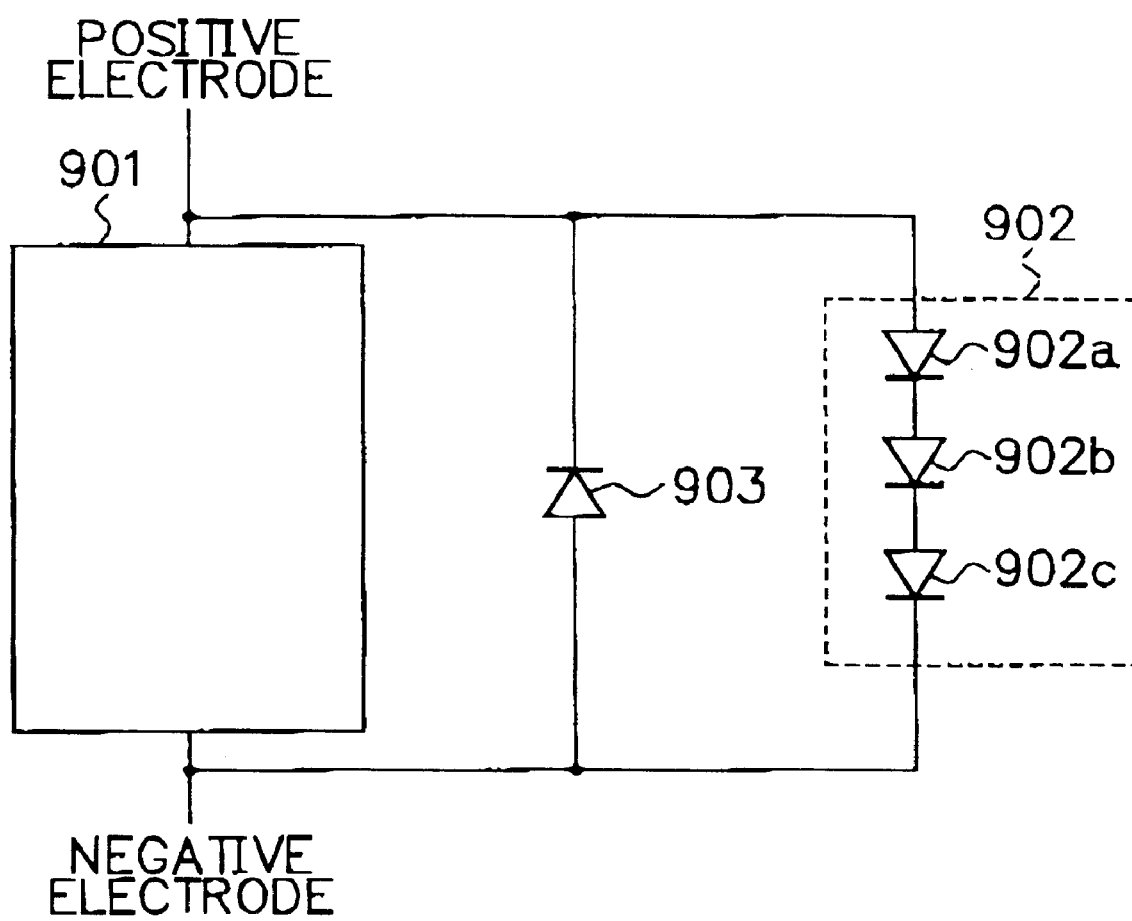
FIG. 9(A) is a schematic diagram illustrating an example of a circuit configuration as a part of a solar cell module in the present invention.

FIG. 9(A) is a schematic diagram illustrating an example of a circuit configuration as a part of a solar cell module in the present invention, where said part is a unit corresponding to one photovoltaic element (the unit will be hereinafter referred to as "solar cell element unit").

In the solar cell element unit shown in FIG. 9(A), a photovoltaic element 901, an overvoltage preventive element 902 and a current bypass element 903 are electrically connected in parallel connection. A plurality of solar cell element units configured as shown in FIG. 9(A) are electrically connected with each other typically in series connection or occasionally in parallel connection to establish a solar cell module.

The overvoltage preventive element 902 in this embodiment comprises a serialized body comprising two PN junction diodes 902a and 902b and one Schottky barrier diode 902c.

As shown in FIG. 9 (A), the photovoltaic element 901 and the overvoltage preventive element 902 are electrically connected in parallel connection in a forward direction, and the photovoltaic element 901 and the current bypass element 903 are electrically connected in series connection in a reverse direction. By this, when the photovoltaic element 901 is shaded, the current bypass element 903 automatically conducts, and when the photovoltaic element 901 is irradiated with light and the load is lighter than a certain extent, the overvoltage preventive element 902 automatically conducts. In this embodiment, a control device and the like are not necessitated.

Figure 9B:
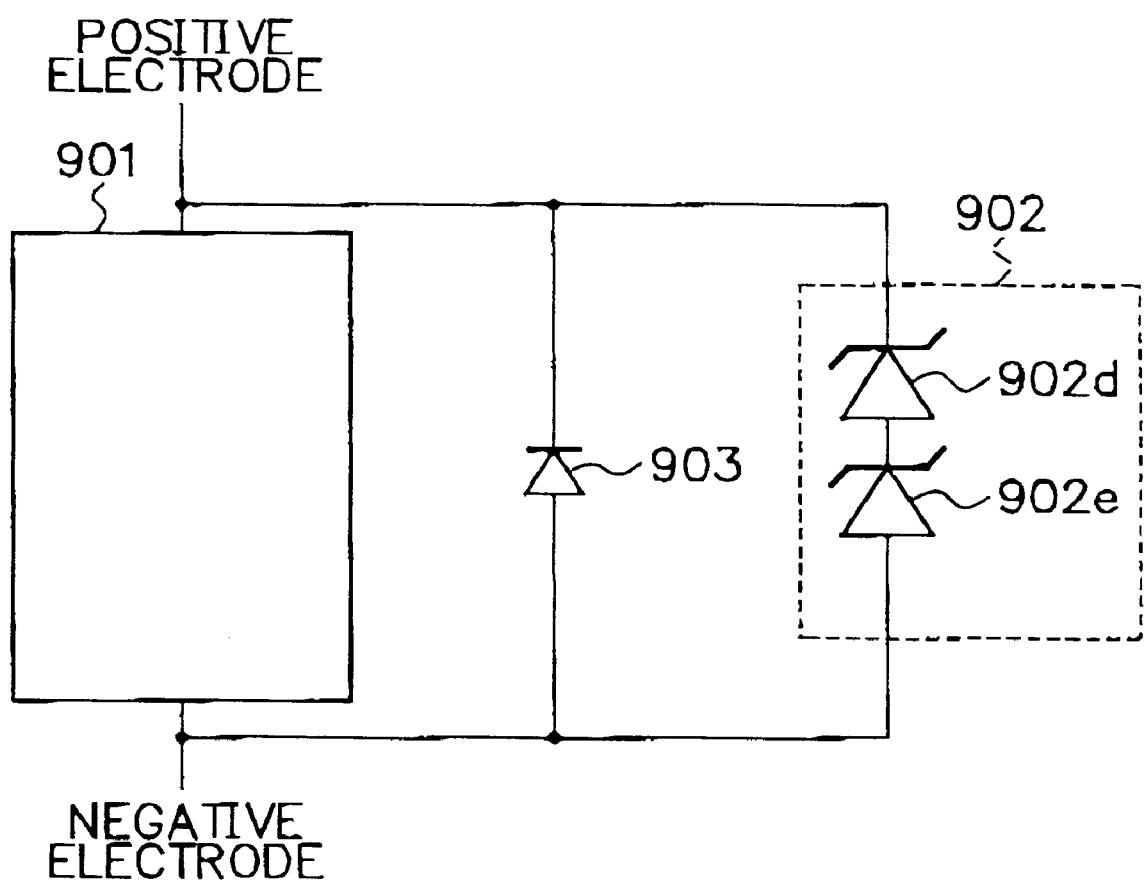
FIG. 9(B) is a schematic diagram illustrating another example of a circuit configuration as a part of a solar cell module in the present invention.

FIG. 9(B) is a schematic diagram illustrating an example of a circuit configuration as a part of a solar cell module in the present invention, where said part is a unit corresponding to one photovoltaic element (the unit will be hereinafter referred to as "solar cell element unit").

In the solar cell element unit shown in FIG. 9(B), a photovoltaic element 901, an overvoltage preventive element 902 and a current bypass element 903 are electrically connected in parallel connection. A plurality of solar cell element units configured as shown in FIG. 9(B) are electrically connected with each other typically in series connection or occasionally in parallel connection to establish a solar cell module.

The overvoltage preventive element 902 in this embodiment comprises a serialized body comprising two constant voltage diodes 902d and 902e.

As shown in FIG. 9(B), the photovoltaic element 901 and the overvoltage preventive element 902 are electrically connected in parallel connection in a reverse direction, and the photovoltaic element 901 and the current bypass element 903 are electrically connected in parallel connection in a reverse direction. By this, when the photovoltaic element 901 is shaded, the current bypass element 903 automatically conducts, and when the photovoltaic element 901 is irradiated with light and the load is lighter than a certain extent, the overvoltage preventive element 902 automatically conducts. In this embodiment, a control device and the like are not necessitated.

FIG. 10 is a schematic plan view illustrating an example of the constitution of a solar cell module in the present invention.

In the solar cell module shown in FIG. 10, three photovoltaic elements 1001a, 1001b and 1001c are electrically connected with each other in series connection.

In FIG. 10, reference numeral 1002 indicates a surface electrode tub (as a positive electrode), reference numeral 1003 a back electrode tub (as a negative electrode), reference numeral 1004 an overvoltage preventive element (comprising any of the foregoing overvoltage preventive elements), reference numeral 1005 a current bypass element (comprising any of the foregoing current bypass elements), reference numeral 1006 a negative terminal electrode, and reference numeral 1007 a positive terminal electrode.

As shown in FIG. 10, the surface electrode tub 1002 is connected to back faces of each adjacent photovoltaic elements. Between the back electrode tub 1003 of and the surface electrode tub 1002 of each photovoltaic element, the overvoltage preventive element 1004 and the current bypass element 1005 are installed in parallel. And for the photovoltaic elements 1001a and 1001c which are situated on the opposite end sides, the negative electrode taking-out electrode 1006 is fixed to the photovoltaic element 1001a through the surface electrode tub 1002, and the positive electrode taking-out electrode 1007 is fixed to the photovoltaic element 1001c through the back electrode tub 1003.

In FIG. 10, the overvoltage preventive element 1004 and the current bypass element 1005 are arranged so that they are visible from the light receiving face side of the solar cell for the purpose of better understanding. However, in view of raising the photoelectric conversion efficiency of the solar cell module, it is preferred for them to be arranged on the back side of the solar cell module.

Preparation of Solar Cell Module

FIG. 11 is a schematic cross-sectional view illustrating an example of a complete solar cell module in the present invention.

The solar cell module shown in FIG. 11 comprises a body comprising a serialized solar cell body 1101 [which comprises a plurality of solar cells comprising a plurality of photovoltaic elements having such configuration as previously described and having any of the foregoing overvoltage preventive elements and if necessary, any of the foregoing current bypass elements which are electrically serialized] enclosed in a transparent resin adhesive 1102 (comprising, for instance, EVA (ethylene-vinyl acetate copolymer), wherein said body is resin-sealed between a surface protective film 1103 having weatherability (comprising, for instance, a fluororesin film) and a back face metallic metal member 1104 which makes the solar cell module to be in a desired form.

Figure 12:
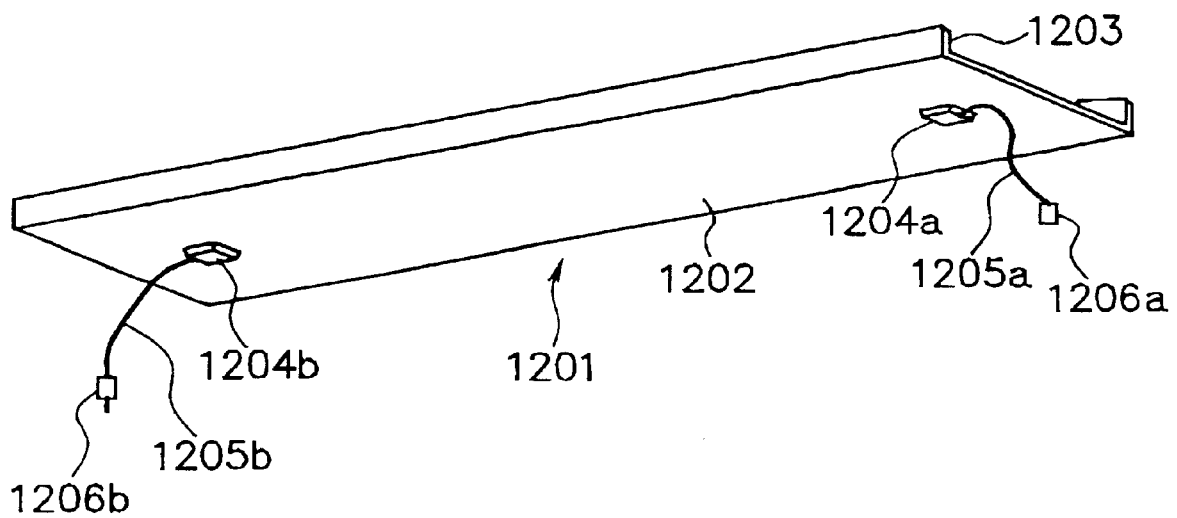
FIG. 12 is a schematic view illustrating an exterior of an example of a roof-integral type solar cell module in the present invention.

FIG. 12 is a schematic view illustrating an exterior of an example of a roof-integral type solar cell module in the present invention.

In FIG. 12, reference numeral 1201 indicates a solar cell module having such constitution as described in the above, and reference numeral 1202 a back face metallic member which makes the solar cell module 1201 to be in a desired form capable of being used as a roofing material. Namely, the solar cell module 1201 shown in FIG. 12 is shaped to have opposite upstanding end portions 1203 comprising the back face metallic member 1202. In the case where the solar cell module 1201 is used as a roofing material, the solar cell module 1201 is coupled with adjacent solar cell modules through the upstanding end portions 1203. It is possible that a plurality of solar cell modules are integrated in this way to form a roof.

By varying the shape of the back metallic member 1202, it is possible to form a roof having a desired shape and which excels in exterior appearance.

At the back metallic member 1202, a pair of output terminal boxes 1204a and 1204b are provided, where a power output connection cable 1205a extending from the solar cells in the solar cell module is drawn to the outside through the output terminal box 1204a, and similarly, another power output connection cable 1205b extending from the solar cells in the solar cell module is drawn to the outside through the output terminal box 1204b. The power output connection cable 1205a is provided with a connector 1206a, and the power output connection cable 1205b is provided with a connector 1206b. These connectors 1206a and 1206b serve to connect the solar cell module to other solar cell modules. Through the connectors 1206a and 1206b, a plurality of solar cell modules are electrically connected with each other to establish a solar cell module string. And, the solar cell module string is electrically connected to a power conversion apparatus, a load and the like by means of the connection cables 1205a and 1205b and the connectors 1206a and 1206b, whereby a sunlight power generation system is established.

In the following, the present invention will be described in more detail with reference to examples. It should be understood that these examples are only for the illustrative purpose and not intended to restrict the scope of the present invention.

Provision of Photovoltaic Elements

There were provided a plurality of amorphous photovoltaic elements having such previously described configuration. It is known that an amorphous solar cell unavoidably suffers from light degradation. Therefore, these photovoltaic elements were exposed to irradiation of standard light (spectrum: AM 1.5, intensity: 1 kW/m$^2$) for a half year, whereby they were stabilized. The characteristics of each of the stabilized photovoltaic elements under the standard light were found to be 1.585 W for the maximum output, 2.032 V for the open-circuit voltage, and 1.477 V for the optimum operating voltage.

These photovoltaic elements were used in the following examples.

EXAMPLE 1

In this example, a solar cell module was prepared using three of the photovoltaic elements provided in the above.

A specific overvoltage preventive element according to the present invention was connected in parallel to each of the three photovoltaic elements to obtain a solar cell element unit. In this way, there were obtained three solar cell element units. These three solar cell element units were electrically serialized with each other, and using this serialized body, a solar cell module having such configuration as previously described was prepared in accordance with the foregoing manner of preparing a solar cell module.

The overvoltage preventive element in each solar cell element unit was made to have such series connection form as shown in FIGS. 6(A) and 6(B). Particularly, as the constituent element of the overvoltage preventive element, there were used two PN junction silicon diode chips of 2.5 mm×2.5 mm in size obtained from a mesa type PN junction silicon diode chip produced by GI company (rise voltage: 0.75 V, thickness: 0.25 mm, size: 4.5 mm×4.5 mm) by changing the size of the mesa type PN junction silicon diode chip to a size of 2.5 mm×2.5 mm. As each of the electrode tubs and the intermediate connection electrode tub, there was used a tinned copper foil. The size of each of the electrode tubs and the intermediate connection electrode tub was made to be 0.1 mm in thickness, 5 mm in width and 15 mm in length.

The joining of the electrode tubs, the intermediate connection electrode tub and the constituent element was conducted by way of soldering. And the overvoltage preventive element was connected to the photovoltaic element in parallel connection in a forward direction to the photovoltaic element.

In this embodiment, by adopting a serialized body of the two PN junction silicon diodes, the overvoltage preventive element was made to have a minimum operating voltage of about 1.5 V which is greater than the optimum operating voltage of the photovoltaic element but is smaller than the open-circuit voltage of the photovoltaic element.

By constituting each of the overvoltage preventive elements as shown in FIGS. 6(A) and 6(*B*), when the photovoltaic elements were integrally resin-sealed in the weatherable resin to obtain the solar cell module, resin sealing defect and the like were prevented from occurring in the resin-sealing process and irregularities were prevented from occurring at the exterior of the solar cell module obtained.

EXAMPLE 2

The procedures of Example 1 were repeated except for the following points.

That is, the series connection form of each overvoltage preventive element was changed to such series connection form as shown in FIGS. 7(A) and 7(B); as the constituent element, there were used two PN junction silicon diode chips of 2.5 mm×2.5 mm in size obtained from a mesa type PN junction silicon diode chip produced by GI company (rise voltage: 0.75 V, thickness: 0.25 mm, size: 4.5 mm×4.5 mm) by changing the size of the mesa type PN junction silicon diode chip to a size of 2.5 mm×2.5 mm and one Schottky barrier diode chip of 2.5 mm×2.5 mm in size obtained from a Schottky barrier diode chip produced by Origin Electric Company (rise voltage: 0.4 V, thickness: 0.25 mm, size: 4.5 mm×4.5 mm) by changing the size of the Schottky barrier diode chip to a size of 2.5 mm×2.5 mm; and three solar cell element units were prepared in the same manner as in Example 1. These three solar cell element units were electrically serialized with each other, and using this serialized body, a solar cell module was prepared as well as in Example 1.

In this embodiment, by adopting a serialized body of the two PN junction silicon diodes and a Schottky barrier diode, the overvoltage preventive element was made to have a minimum operating voltage of about 1.9 V which is greater than the optimum operating voltage of the photovoltaic element but is smaller than the open-circuit voltage of the photovoltaic element.

By constituting each of the overvoltage preventive elements as shown in FIGS. 7(A) and 7(B), when the photovoltaic elements were integrally resin-sealed in the weatherable resin to obtain the solar cell module, resin sealing defect and the like were prevented from occurring in the resin-sealing process and irregularities were prevented from occurring at the exterior of the solar cell module obtained.

COMPARATIVE EXAMPLE 1

The procedures of each of Examples 1 and 2 were repeated, except that no overvoltage preventive element was provided at each of the photovoltaic elements, to obtain a solar cell module in each case.

Evaluation

For each of the solar cell modules obtained in Examples 1 and 2 and Comparative Example 1, performance evaluation test was conducted, where the output characteristics (the current-voltage characteristics) of each solar cell module were directly measured using a commercially available solar cell module performance measuring apparatus of type 240A (produced by SPIRE Company).

Figure 13:
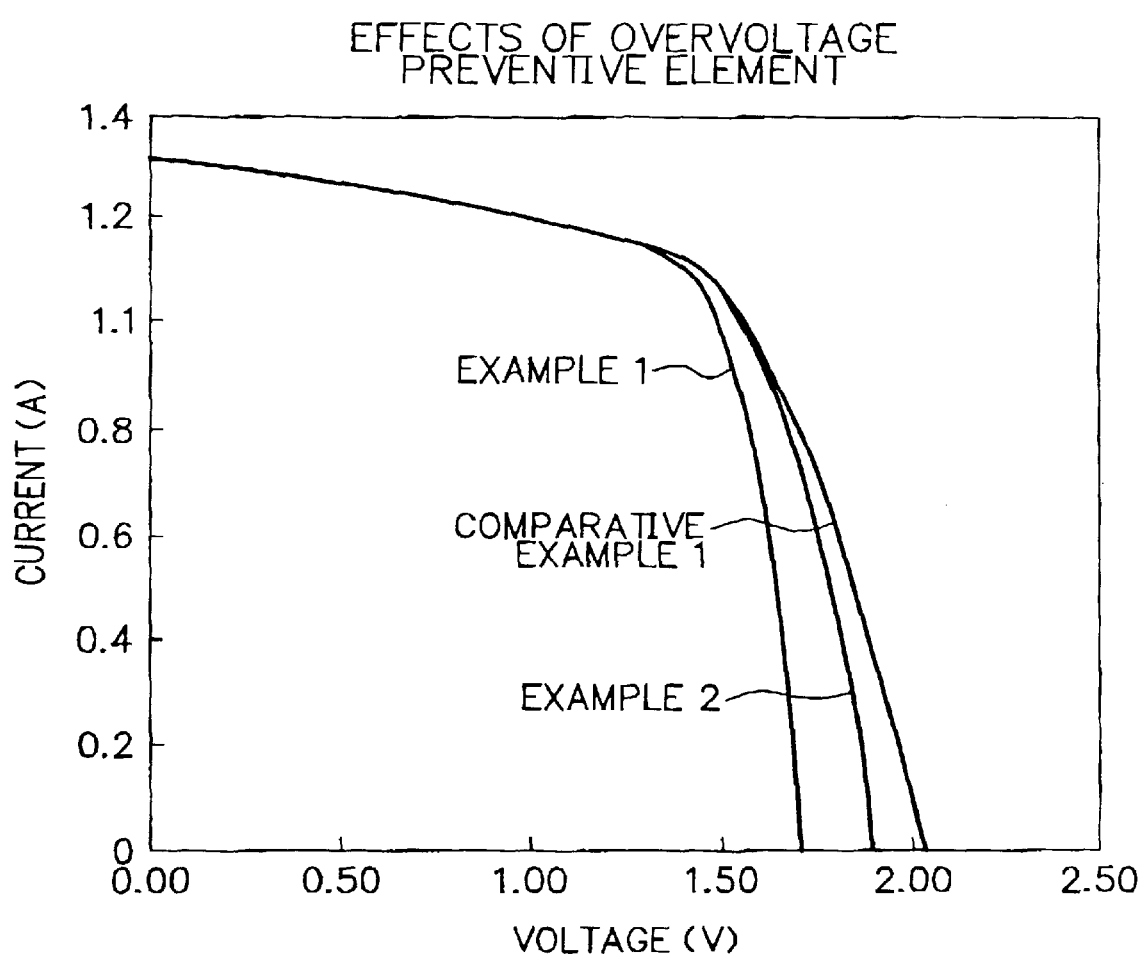
FIG. 13 shows graphs of output characteristics of solar cells obtained in examples 1 and 2 and comparative example 1 which will be described later.

The measured output characteristics are graphically and collectively shown in FIG. 13. That is, the curves shown in FIG. 13 are corresponding to current voltage characteristic curves for Examples 1 and 2 and Comparative Example 1. In FIG. 13, each of the measured voltage value and the measured power value is a value converted per one photovoltaic element, which is corresponding to ⅓ of the solar cell module as a whole.

The numerical values of the important characteristic obtained by the measurement are collectively shown in Table 1.

On the basis of the results shown in FIG. 13 and Table 1, the followings are understood.

Comparison of Maximum Output:

The loss in the output by the provision of the overvoltage preventive element in each of Examples 1 and 2 is very slight, particularly that in Example 2 is almost zero.

Comparison of Open-Circuit Voltage:

The proportion of a reduction in the open-circuit voltage is about 15% in Example 1 and it is about 6% in Example 2. From this, it is understood that for various apparatus connected to the solar cell direct current circuit, those which are relatively inferior in terms of withstand voltage can be used.

Comparison of Optimum Operating Voltage/Open-Circuit Voltage:

The [optimum operating voltage/open-circuit voltage] is 0.727 in Comparative Example 1, 0.789 in Example 1, and 0.772 in Example 2. From this, it is understood that the use of the overvoltage preventive element diminishes the difference between the optimum operating voltage and the open-circuit voltage.

That is, according to the present invention, it is possible that while the output loss of the solar cell (the photovoltaic element) being maintained at a relatively small extent, the open-circuit voltage is decreased and occurrence of overvoltage is effectively prevented. Particularly, in the case of a solar cell module in which a photovoltaic element whose photoelectric conversion layer having a three-layered structure containing amorphous silicon and amorphous germanium materials is used, by using an overvoltage preventive element comprising a serialized body comprising two PN junction diodes and one Schottky barrier diode as in Example 2, it is possible to make the output loss of the solar cell module to be almost zero.

Particularly, with reference to FIG. 13, in the case of the solar cell module of Example 2, it is understood that the optimum operating point of the current-voltage characteristic curve per one photovoltaic element of the solar cell module is substantially not changed, the difference between the optimum operating voltage and the open-circuit voltage is diminished, and the gradient of the straight line of connecting the optimum operating point and the open-circuit voltage point is greater than that of the solar cell module of Comparative Example 1.

Because the open-circuit voltage is desirably controlled in the present invention as previously described, for the instruments including an inverter and the like which are connected to the solar cell module, those which are relatively inferior in terms of withstand voltage can be used. This situation leads to the further reduction of the production cost of a solar cell module and also of a sunlight power generation system.

As previously described, the operation of preventing occurrence of overvoltage in a solar cell module has been known. However, in the present invention, a specific overvoltage preventive element is provided at each of the photovoltaic elements installed in the solar cell module whereby decentralization of heat-generation sources and curtailment of the installation place for an overvoltage-preventing means which is necessitated in the prior art are realized, and the optimum constitution of the overvoltage preventive element is actualized so that the overvoltage preventive element effectively and efficiently exhibits its overvoltage-preventing function.

Cell Freedom:

The term "cell freedom" is meant as a selectable range for the number of the solar cell element units to be serialized.

In the above, based on the results obtained in the performance evaluation test, it has been described that by installing the specific overvoltage preventive element according to the present invention, while the output loss is maintained at a small extent, the open-circuit voltage can be controlled as desired and the ratio of the optimum operating voltage/the open-circuit voltage can be controlled to be large. In the following, description will be made of what effect the above facts bring about in a sunlight power generation system, with reference to Examples 1 and 2 and Comparative Example 1. The "effect" here means that the cell freedom (the selectable range for the number of the solar cell element units to be serialized) in a sunlight power generation system is increased, particularly in the case of a building's roof which has a limited area, the availability for solar cells to be arranged on the roof is improved.

For each of Examples 1 and 2 and Comparative Example 1, with respect to an inverter A whose usable voltage range is from 155 V to 300 V and an inverter B whose usable voltage range is from 250 V to 450 V, the cell freedom was calculated.

For the solar cell element unit in each of Examples 1 and 2 and Comparative Example 1, the range of a serializable number of the solar cell element unit capable of being connected to the inverter A in each case is shown in Table 2, and the range of a serializable number of the solar cell element unit capable of being connected to the inverter B in each case is shown in Table 3.

For the simplification purpose, the serializable number of the solar cell element unit capable of being connected to each inverter was calculated in accordance with the following equations.

(i) A lower limit value for the serializable number of the solar cell element unit capable of being connected to each inverter=an integer part of a value obtained by the equation: (a lower limit value for the voltage capable of using the inverter)/(the optimum operating voltage)+1.

(ii) An upper limit value for the serializable number of the solar cell element unit capable of being connected to each inverter=an integer part of a value obtained by the equation: (an upper limit value for the voltage capable of using the inverter)/(the open-circuit voltage).

Hence, the cell freedom can be expressed by the following equation.

(cell freedom)=(the upper limit value for the serializable number of the solar cell element unit capable of being connected to the inverter)−(the lower limit value for the serializable number of the solar cell element unit capable of being connected to the inverter).

From Tables 2 and 3, the following facts are understood.

(1) By using a specific overvoltage preventive element according to the present invention, the cell freedom for the solar cell element unit to each inverter is increased. This situation enables to design various arrangements for solar cells in a sunlight power generation system.

(2) By using a specific overvoltage preventive element according to the present invention, the upper limit for the number of the solar cell element unit to be capable of being used is enlarged. This situation enables to establish a sunlight power generation system having a high system voltage and which is slight in the system loss.

Now, it is known that the higher the system voltage of a sunlight power generation system is, the smaller the system loss is.

Separately, in the case where a sunlight power generation system is constructed by using a plurality of solar cell modules having such configuration as previously described in which a plurality of photovoltaic elements having the overvoltage preventive element according to the present invention are integrally sealed in a weatherable resin, it is possible to optionally design the arrangement of the solar cell modules so as to comply with various roof forms. Particularly, when the back metallic member is designed so as to comply with a given roof form, it is possible to establish a solar cell roof which excels in exterior appearance.

Further, in each of Examples 1 and 2, it is possible to adopt the constitution shown in FIG. 10 such that an appropriate current bypass element is connected in parallel to each photovoltaic element in each of Examples 1 and 2. In any of these cases, desirable current-voltage characteristics and cell freedom can be attained as well as in each of the foregoing Examples 1 and 2.

COMPARATIVE EXAMPLE 2

The procedures of Example 1 were repeated, except for the following point, to obtain a solar cell module.

That is, as the constituent element of each overvoltage preventive element, there were used one PN junction silicon diode chip of 2.5 mm×2.5 mm in size obtained from a mesa type PN junction silicon diode chip produced by GI company (rise voltage: 0.75 V, thickness: 0.25 mm, size: 4.5 mm×4.5 mm) by changing the size of the mesa type PN junction silicon diode chip to a size of 2.5 mm×2.5 mm.

The overvoltage preventive element is connected in parallel to the photovoltaic element in a forward direction to the photovoltaic element.

The overvoltage preventive element was prepared as well as in the case of the current bypass element shown in FIGS. 8(A) and 8(B), where the overvoltage preventive element was prepared by sandwiching the PN junction silicon diode chip by the electrode tubs 802a and 802b. The PN junction silicon diode used in this comparative example is of a rise voltage of 0.75 V.

The overvoltage preventive element used in this comparative example was about 0.75 V for the minimum operating voltage, which was markedly smaller than the optimum operating voltage of the photovoltaic element used, being about a half of the optimum operating voltage of the photovoltaic element. Because of this, the power loss in this comparative example reached nearly 50%, and the power outputting efficiency was significantly decreased.

In comparison of Examples 1 and 2 with Comparative Example 2, it was found that by using a specific overvoltage preventive element whose minimum operating voltage is greater than the optimum operating voltage of the photovoltaic element but is smaller than the open-circuit voltage of the photovoltaic element, significant overvoltage-preventing effects are provided while minimizing the power loss.

Now, it is a matter of course that when the minimum operating voltage of the overvoltage-preventive element is greater than the open-circuit voltage of the photovoltaic element, no overvoltage-preventing effect is provided.

EXAMPLE 3

In this example, a solar cell module was prepared using three of the photovoltaic elements provided in the foregoing step of provision of photovoltaic elements.

A specific overvoltage preventive element according to the present invention was connected in parallel to each of the three photovoltaic elements to obtain a solar cell element unit. In this way, there were obtained three solar cell element units. These three solar cell element units were electrically serialized with each other, and using this serialized body, a solar cell module having such configuration as previously described was prepared in accordance with the foregoing manner of preparing a solar cell module.

The overvoltage preventive element in each solar cell element unit was made to have such series connection form as shown in FIGS. 6(A) and 6(B). Particularly, as the constituent element of the overvoltage preventive element, there were used two Zener diode chips of 2.5 mm×2.5 mm in size obtained from a commercially available Zener diode chip (thickness: 0.25 mm, size: 4.5 mm×4.5 mm) by changing the size of the Zener diode chip to a size of 2.5 mm×2.5 mm. As each of the electrode tubs and the intermediate connection electrode tub, there was used a tinned copper foil. The size of each of the electrode tubs and the intermediate connection electrode tub was made to be 0.1 mm in thickness, 5 mm in width and 15 mm in length.

The joining of the electrode tubs, the intermediate connection electrode tub and the constituent element was conducted by way of soldering. And the overvoltage preventive element was connected to the photovoltaic element in parallel connection in a reverse direction to the photovoltaic element.

In this embodiment, by adopting a paralleled body of the two zener diodes, the overvoltage preventive element was made to have a minimum operating voltage (a breakdown voltage in this case) of about 1.9 V which is greater than the optimum operating voltage of the photovoltaic element but is smaller than the open-circuit voltage of the photovoltaic element.

Also in this example, the performance evaluation test which was conducted with respect to Examples 1 and 2 and Comparative Example 1 was conducted in the same manner.

As a result, it was found that the overvoltage preventive element used in this example provides desirable overvoltage-preventing effects as well as in each of Examples 1 and 2. Further, the cell freedom was calculated in the same manner as in Examples 1 and 2 and Comparative Example 1. As a result, the cell freedom in this example was found to be greater in comparison with that in Comparative Example 1.

In this example, because the overvoltage preventive element is connected to each photovoltaic element in parallel connection in the reverse direction to the photovoltaic element, the overvoltage preventive element also exhibits a current bypass function.

In the solar cell module of this example, it is possible to adopt a constitution in which a current bypass element is connected to each photovoltaic element in parallel connection (that is, a constitution in which the photovoltaic element, the overvoltage preventive element and the current bypass element are connected in parallel connection, where the current bypass element and the photovoltaic element are connected in parallel connection in a reverse direction). In this case, desirable current-voltage characteristics and cell freedom are obtained as well as in the above case.

Commercial system-combined network system with no reverse flow:

Description will be made of the advantages of the present invention when the solar cell module of the present invention is used in a commercial power supply system-combined network system (which is occasionally called a direct-current system) in which one or more solar cells are connected to a direct-current circuit obtained by rectifying such a commercial power supply system as shown in FIG. 1 to supply an electric power to a given load.

In general, in the commercial system-combined network system, there is a severe restriction for the voltage range in order to efficiently use the solar cells. The reason for this is that when the voltage in the commercial supply system is, for instance, 200 V of alternate current, a voltage obtained by rectifying this voltage is about 280 V, and therefore, when the sum of the optimum operating voltages of the solar cells is not beyond this value, the electric power supplied to the load from the solar cells is diminished. In practice, the voltage of the electric power supplied from the commercial power supply system is of about 210 V in many cases, and therefore, the sum of the optimum operating voltages of the solar cells is necessary to be at least about 300 V.

Separately, for instance, for an inverter used for driving a power load such as a fan or pump at a variable speed, it is optimized to the commercial power supply system in order to reduce the cost. Particularly, in many cases, the withstand voltage of a component such as a primary side electrolytic condenser which is used in an inverter for 200 V is 400 V.

In this connection, for the inverter used, the range for the voltage at which the inverter can be used is from 300 V to 400.

Here, with respect to an inverter whose usable voltage range is from 300 V to 400 V, a lower limit and an upper limit for a serializable number of the solar cell element unit of each of Example 2 and Comparative Example 1 which is capable of being connected to the inverter and a cell freedom in each case were calculated in accordance with the foregoing calculation manner. The calculated results are collectively shown in Table 4.

From Table 4, it is understood that the cell freedom of Comparative Example 1 in which no overvoltage preventive element was used is zero (0), and therefore, the use of the overvoltage preventive element in the commercial power system-combined network system (the direct-current system) is indispensable.

In the following, discussion will be made by comparing a case wherein a plurality of overvoltage preventive elements are externally added such that they are arranged to converge at one place (that is, such a system as shown in FIG. 1) with a case wherein an overvoltage preventive element is provided at each photovoltaic element.

From FIG. 13, it is understood that the maximum output (1.583 W) of the solar cell module of Example 2 is almost the same as that (1.585 W) of the solar cell module of Comparative Example 1 (see, Table 1). Here, consideration will be made of a case wherein a motor of, for instance, about 2 HP (=1500 W) is driven by a solar cell module. Based on Table 4, a solar cell module is structured by electrically connecting 206 solar cell units of Example 2 with each other in series connection. The total output of this solar cell module becomes about 325 W. In order to sufficiently drive said motor, about 6 solar cell modules having this configuration are necessitated.

On the other hand, when no load is present, it is understood by way of calculation that a power of about 0.6 W is consumed in one overvoltage preventive element. That is, in the case where the operating voltage per one solar cell element unit of Comparative Example 1 is equal to the open-circuit voltage per one solar cell element unit, the output per one solar cell element unit of Comparative Example 1 corresponds to the power consumed in the overvoltage preventive element of each solar cell element unit of Example 2.

Therefore, the total quantity of the powers consumed in the overvoltage preventive elements in one of the above solar cell modules becomes about 124 W when no load is present. In this connection, the total loss quantity of the 6 solar cell module becomes about 744 W. This loss quantity corresponds to the heat generated by a small stove. This means that such heat generation has occurred in the overvoltage preventive elements.

In the case of the present invention, because the overvoltage preventive element is provided at each photovoltaic element, such energy sources are distributed over the entirety of a solar cell array (comprising the solar cell modules). On the other hand, in the case where the overvoltage preventive elements are externally added such that they are arranged to converge at one place, it is necessitated to establish an extra space for the overvoltage preventive elements to sufficiently radiate heat therein and in addition, it is necessitated to take measures for safety.

Consequently, according to the present invention, it is possible to readily establish a desirable commercial power supply system-combined network system in a simple manner.

Further, the solar cell module according to the present invention is desirably used also in a sunlight power generation system provided with a system interconnection inverter capable of reversely flowing a D.C. output of the solar cell module into an A.C. system.

It should be understood that the present invention is not restricted by these examples. The embodiments can be modified in various ways within the range where the principle of the present invention is not hindered.

Further, in the examples of the present invention, a photovoltaic element whose photoelectric conversion layer having a three-layered structure comprising amorphous materials containing silicon or/and germanium atoms was used. However, this is not limitative. It is possible to use other photovoltaic elements such as a photovoltaic element having a photovoltaic conversion layer comprising an amorphous semiconductor material containing either silicon atoms or germanium atoms, a photovoltaic element having a single crystal silicon layer, and the like.

As described in the above, the present invention provides such significant advantages as will be described below.

(1) Because occurrence of overvoltage in the case where no load is present or a load is small can be effectively prevented, when instruments such as a power conversion device and the like which are of the same withstand voltage are used in a sunlight power generation system, the selective range for a serialization number of solar cells (or photovoltaic elements) used in the sunlight power generation system is improved.

(2) A sunlight power generation system whose system voltage is high can be established, and therefore, the system loss is diminished.

(3) In the case where a plurality of serialized bodies each comprising a plurality of solar cells (or photovoltaic elements) electrically serialized are used, when the serialized bodies are the same in terms of the serialized number, instruments such as a power conversion device and the like which are relatively inferior in terms of the withstand voltage can be used. Because of this, these instruments may be those which are less expensive. Thus, it is possible to attain a desirable sunlight power generation system at a reasonable production cost. This situation greatly contributes in spreading a sunlight power generation system. Particularly, the fill factor of a photovoltaic element having a photoelectric conversion layer comprising an amorphous semiconductor material containing at least either silicon atoms or germanium atoms is inferior to that of a photovoltaic element comprising a single crystal silicon material, and therefore, the above advantages are significant in a sunlight power generation system in which a plurality of such photovoltaic elements having a photoelectric conversion layer comprising an amorphous semiconductor material containing at least either silicon atoms or germanium atoms are used.

(4) Because a specific overvoltage preventive element is accommodated in each photovoltaic element, it is not necessary to provide a specialized space for an overvoltage-preventing means to arrange as in the prior art. In addition, because specific overvoltage preventive elements are arranged so as to distribute among the photovoltaic elements, heat generated is not converged and therefore, heat radiation is readily and effectively performed as desired.

(5) By constituting the overvoltage preventive element by a plurality of constituent elements, overvoltage preventing effects with slight loss can be achieved.

(6) By selecting a proper electrical connection pattern between the constituent elements in the preparation of an overvoltage preventive element, it is possible to attain a desirable overvoltage preventive element at a reasonable cost. This situation results in a reduction in the production cost of a desirable solar cell module.

(7) It is not necessary to use a particular voltage control device and therefore, neither a specialized space therefor nor wiring therefor are not necessitated.

(8) In the case of adopting a solar cell module configuration in which a plurality of photovoltaic elements are integrally sealed in a weatherable resin, resin sealing defect is hardly occurred and irregularities are hardly occurred at the exterior of the solar cell module obtained.

(9) By structuring a solar cell module by using a back face metallic member and an overvoltage preventive member in which a thin constituent element is used, it is possible to attain a solar cell module which can be readily processed. Particularly, in the case where a photovoltaic element containing an amorphous silicon material is used, this advantage is significant.

TABLE 1

|  | Example 1 | Example 2 | Comparative Example 1 |
|---|---|---|---|
| optimum output (W) | 1.552 | 1.583 | 1.585 |
|  | (96.0) | (99.9) | (100) |
| open-circuit voltage (V) | 1.722 | 1.906 | 2.032 |
|  | (84.7) | (93.8) | (100) |
| optimum operating voltage (V) | 1.374 | 1.471 | 1.477 |
|  | (93.0) | (99.6) | (100) |
| optimum operating voltage/open-circuit voltage | 0.798 | 0.772 | 0.727 |

NOTE: the figure in each parentheses of Example 1 and Example 2 is a relative value to the corresponding measured value of Comparative Example 1, which is set at 100.

TABLE 2

|  | Example 1 | Example 2 | Comparative Example 1 |
|---|---|---|---|
| a lower limit value for a serializable number of the solar cell element unit capable of being connected to the inverter | 113 | 106 | 105 |
| an upper limit value for a serializable number of the solar cell element unit capable of being connected to the inverter | 174 | 157 | 147 |
| cell freedom (selectable range for the number of the solar cell element units) | 61 | 51 | 42 |

TABLE 3

|  | Example 1 | Example 2 | Comparative Example 1 |
|---|---|---|---|
| a lower limit value for a serializable number of the solar cell element unit capable of being connected to the inverter | 182 | 170 | 170 |
| an upper limit value for a serializable number of the solar cell element unit capable of being connected to the inverter | 261 | 236 | 221 |

TABLE 3-continued

| | Example 1 | Example 2 | Comparative Example 1 |
|---|---|---|---|
| cell freedom (selectable range for the number of the solar cell element units) | 79 | 66 | 51 |

TABLE 4

| | Example 2 | Comparative Example 1 |
|---|---|---|
| a lower limit value for a serializable number of the solar cell element unit capable of being connected to the inverter | 204 | 204 |
| an upper limit value for a serializable number of the solar cell element unit capable of being connected to the inverter | 209 | 196 |
| cell freedom (selectable range for the number of the solar cell element units) | 5 | 0 |

What is claimed is:

1. A solar cell module in which a plurality of photovoltaic elements are installed in such a manner as to be electrically connected with each other, wherein an overvoltage preventive element is electrically connected to each of said photovoltaic elements in parallel connection, and said overvoltage preventive element exhibits a one-way continuity and has a minimum operating voltage which is smaller than an open-circuit voltage of and greater than an optimum operating voltage of a photovoltaic element to which said overvoltage preventive element is electrically connected.

2. The solar cell module according to claim 1, wherein said overvoltage preventive element comprises a plurality of constituent elements which are connected in series and/or parallel connection.

3. The solar cell module according to claim 1, wherein said overvoltage preventive element and a photovoltaic element are connected in parallel connection in a forward direction, and the minimum operating voltage of said overvoltage preventive element is a minimum operating voltage when a forward voltage is impressed to said overvoltage preventive element.

4. The solar cell module according to claim 1, wherein said overvoltage preventive element comprises a plurality of constituent elements electrically connected with each other, and each of said plurality of constituent elements is connected to a photovoltaic element in parallel connection in a forward direction.

5. The solar cell module according to claim 4, wherein at least one of the constituent elements comprises a diode.

6. The solar cell module according to claim 5, wherein the constituent elements comprise a PN junction diode, a Schottky barrier diode or a combination of a PN junction diode or a Schottky barrier diode with a resistance element.

7. The solar cell module according to claim 1, wherein said overvoltage preventive element and a photovoltaic element are connected in parallel connection in a reverse direction, and the minimum operating voltage of said overvoltage preventive element is a minimum operating voltage when a reverse voltage is impressed to said overvoltage preventive element.

8. The solar cell module according to claim 1, wherein said overvoltage preventive element comprises a plurality of constituent elements electrically connected with each other, and each of said plurality of constituent elements is connected to a photovoltaic element in parallel connection in a reverse direction.

9. The solar cell module according to claim 8, wherein at least one of the constituent elements comprises a constant voltage diode.

10. The solar cell module according to claim 9, wherein the constituent elements comprise a constant voltage diode or a combination of a constant voltage diode with a resistance element.

11. The solar cell module according to claim 7, wherein said overvoltage preventive element has a current bypass function.

12. The solar cell module according to claim 1, wherein a photovoltaic element, said overvoltage preventive element and a current bypass element are electrically connected in parallel connection.

13. The solar cell module according to claim 12, wherein the current bypass element has at least a diode.

14. The solar cell module according to claim 1, wherein each of the photovoltaic elements has a photoelectric conversion layer comprising a semiconductor layer containing at least silicon atoms or germanium atoms.

15. The solar cell module according to claim 1, wherein each of the photovoltaic elements has a photoelectric conversion layer containing at least a single crystal silicon material.

16. A solar cell module in which a plurality of photovoltaic elements are installed in such a manner as to be electrically connected with each other, wherein an overvoltage preventive element is electrically connected to each of said photovoltaic elements in parallel connection, said overvoltage preventive element exhibits a one-way continuity, and said overvoltage preventive element comprises a plurality of constituent elements and a plurality of connection members electrically connected to said constituent elements such that one of two of the connection members which are adjacent to one of said constituent elements is connected to an upper side of said one constituent element and the other connection member is connected to a lower side of said one constituent element.

17. The solar cell module according to claim 16, wherein each of the connection members contains at least a component comprising one or more metals selected from the group consisting of Au, Ag, Cu, Pb, Sn and Ni.

18. The solar cell module according to claim 16, wherein said overvoltage preventive element and a photovoltaic element are connected in parallel connection in a forward direction, and said overvoltage preventive element has a minimum operating voltage when a forward voltage is impressed to said overvoltage preventive element, the minimum operating voltage of said overvoltage preventive element being smaller than an open-circuit voltage of and greater than an optimum operating voltage of the photovoltaic element to which said overvoltage preventive element is connected.

19. The solar cell module according to claim 16, wherein said overvoltage preventive element is connected to a photovoltaic element in parallel connection in a reverse direction, and said overvoltage preventive element has a minimum operating voltage when a reverse voltage is impressed to said overvoltage preventive element, the minimum operating voltage of said overvoltage preventive element being smaller than an open-circuit voltage of and greater than an optimum operating voltage of the photovoltaic element to which said overvoltage preventive element is connected.

20. A solar cell module in which a plurality of photovoltaic elements are installed in such a manner as to be electrically connected with each other, wherein an overvoltage preventive element is electrically connected to each of said photovoltaic elements in parallel connection, said overvoltage preventive element exhibits a one-way continuity, and said overvoltage preventive element comprises a plurality of constituent elements and a plurality of connection members electrically connected to said constituent elements, said connection members comprising upper connection members and lower connection members, said constituent elements being spacedly arranged in a common plane while being sandwiched and held between said upper connection members and said lower connection members such that one of said upper connection members is joined to an upper side of (a) one of the constituent elements, one of said lower connection members is joined to a lower side of said constituent element (a) and also to a lower side of (b) the constituent element which is adjacent to said constituent element (a), another upper connection member is joined to an upper side of said constituent element (b) and also to an upper side of (c) the constituent element which is adjacent to said constituent element (b), and one of the remaining lower connection members is joined to a lower side of said constituent element (c).

21. The solar cell module according to claim 20, wherein each of the connection members contains at least a component comprising one or more metals selected from the group consisting of Au, Ag, Cu, Pb, Sn and Ni.

22. The solar cell module according to claim 20, wherein said overvoltage preventive element and a photovoltaic element are connected in parallel connection in a forward direction, and said overvoltage preventive element has a minimum operating voltage when a forward voltage is impressed to said overvoltage preventive element, the minimum operating voltage of said overvoltage preventive element being smaller than an open-circuit voltage of and greater than an optimum operating voltage of the photovoltaic element to which said overvoltage preventive element is connected.

23. The solar cell module according to claim 20, wherein said overvoltage preventive element and a photovoltaic element are connected in parallel connection in a reverse direction, and said overvoltage preventive element has a minimum operating voltage when a reverse voltage is impressed to said overvoltage preventive element, the minimum operating voltage of said overvoltage preventive element being smaller than an open-circuit voltage of and greater than an optimum operating voltage of the photovoltaic element to which said overvoltage preventive element is connected.

24. The solar cell module according to claim 1, wherein a body comprising said plurality of photovoltaic elements each having said overvoltage preventive element is resin-sealed between at least two weatherable supporting members, said supporting members comprising a resin, a glass, a metal or a combination thereof.

25. The solar cell module according to claim 24, wherein at least one of said supporting members comprises a fluororesin.

26. The solar cell module according to claim 24, wherein one of said supporting members includes a metallic member which is provided at a back face of the resin-sealed body, said metallic member having a form corresponding to that of a roofing material.

27. The solar cell module according to claim 1, wherein a body comprising said plurality of photovoltaic elements each having said overvoltage preventive element is embedded in a support comprising a weatherable resin.

28. A sunlight power generation system comprising a solar cell module and a system interconnection inverter capable of reverse-flowing a direct-current output from said solar cell module into an alternate current system, said solar cell module comprising a plurality of photovoltaic elements electrically connected with each other, wherein an overvoltage preventive element is electrically connected to each of said photovoltaic elements in parallel connection, said overvoltage preventive element comprises a plurality of constituent elements, said overvoltage preventive element exhibits a one-way continuity and has a minimum operating voltage which is smaller than an open-circuit voltage of and greater than an optimum operating voltage of a photovoltaic element to which said overvoltage preventive element is connected.

29. A sunlight power generation system comprising a solar cell and a mechanism capable of parallel-coupling a direct current power from said solar cell module and a direct current power obtained from a commercial alternate current power supply system by way of rectification to supply to a load, said solar cell module comprising a plurality of photovoltaic elements electrically connected with each other, wherein an overvoltage preventive element is electrically connected to each of said photovoltaic elements in parallel connection, said overvoltage preventive element comprises a plurality of constituent elements, said overvoltage preventive element exhibits a one-way continuity and has a minimum operating voltage which is smaller than an open-circuit voltage of and greater than an optimum operating voltage of a photovoltaic element to which said overvoltage preventive element is connected.

30. The sunlight power generation system according to claim 29, wherein said load includes a variable frequency-variable voltage inverter and a power load.

* * * * *

UNITED STATES PATENT AND TRADEMARK OFFICE
CERTIFICATE OF CORRECTION

PATENT NO.    : 6,331,670 B2  
DATED         : December 18, 2001  
INVENTOR(S)   : Nobuyoshi Takehara et al.

Page 1 of 1

It is certified that error appears in the above-identified patent and that said Letters Patent is hereby corrected as shown below:

Column 3,  
Line 57, "relative" should read -- relatively --.

Column 5,  
Line 25, "that" should read -- than --.

Column 8,  
Line 9, "spacedly" should read -- space --.

Column 10,  
Line 46, "more" should read -- further --.

Column 21,  
Line 67, "400." should read -- 400 V. --.

Signed and Sealed this

Thirtieth Day of July, 2002

*Attest:*

JAMES E. ROGAN  
*Director of the United States Patent and Trademark Office*

*Attesting Officer*